`US010567638B2`

(12) United States Patent
Tsuchiya et al.

(10) Patent No.: US 10,567,638 B2
(45) Date of Patent: Feb. 18, 2020

(54) ELECTRONIC DEVICE AND COMPUTER PROGRAM PRODUCT FOR SETTING IMAGE CAPTURING CONDITIONS FOR MULTIPLE REGIONS IN IMAGE CAPTURING SENSOR

(71) Applicant: NIKON CORPORATION, Tokyo (JP)

(72) Inventors: Satoshi Tsuchiya, Kawasaki (JP); Yuuki Asano, Narashino (JP); Shuhei Yoshikawa, Tokyo (JP); Aiko Namikawa, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/563,783

(22) PCT Filed: Mar. 30, 2016

(86) PCT No.: PCT/JP2016/060496
§ 371 (c)(1),
(2) Date: Oct. 2, 2017

(87) PCT Pub. No.: WO2016/159143
PCT Pub. Date: Oct. 6, 2016

(65) Prior Publication Data
US 2018/0097988 A1     Apr. 5, 2018

(30) Foreign Application Priority Data

Mar. 30, 2015 (JP) ................................. 2015-070439

(51) Int. Cl.
*H04N 5/225* (2006.01)
*H04N 5/232* (2006.01)
*H04N 5/235* (2006.01)

(52) U.S. Cl.
CPC ......... *H04N 5/23216* (2013.01); *H04N 5/225* (2013.01); *H04N 5/2352* (2013.01); *H04N 5/23293* (2013.01)

(58) Field of Classification Search
None
See application file for complete search history.

(56) References Cited

U.S. PATENT DOCUMENTS

| 2003/0026609 A1* | 2/2003 | Parulski ................. G03B 17/20 396/281 |
| 2003/0090690 A1* | 5/2003 | Katayama ................ G06T 5/00 358/1.9 |

(Continued)

FOREIGN PATENT DOCUMENTS

| CN | 1933558 A | 3/2007 |
| JP | 2006-049361 A | 2/2006 |

(Continued)

OTHER PUBLICATIONS

May 17, 2016 International Search Report issued in International Patent Application No. PCT/JP2016/060496.

(Continued)

*Primary Examiner* — Twyler L Haskins
*Assistant Examiner* — Dwight Alex C Tejano
(74) *Attorney, Agent, or Firm* — Oliff PLC

(57) ABSTRACT

An electronic device includes: an image-capturing unit that captures an image of a subject with an image sensor, the image sensor being configured to be able to set image-capturing conditions for a plurality of regions on an image-capturing surface; and a control unit that determines the image-capturing conditions varied for each of the regions, based on a subject element detected from the image captured by the image-capturing unit.

10 Claims, 20 Drawing Sheets

(56) References Cited

U.S. PATENT DOCUMENTS

| | | | |
|---|---|---|---|
| 2004/0070619 A1* | 4/2004 | Yoshio | G06F 3/04845 |
| | | | 715/764 |
| 2007/0058064 A1* | 3/2007 | Hara | H04N 5/23293 |
| | | | 348/333.01 |
| 2012/0050565 A1 | 3/2012 | Imai | |
| 2012/0069212 A1 | 3/2012 | Imai | |
| 2014/0168463 A1* | 6/2014 | Tamura | H04N 9/735 |
| | | | 348/223.1 |
| 2016/0112644 A1 | 4/2016 | Nishi | |
| 2016/0139774 A1* | 5/2016 | Rivard | G06F 3/04842 |
| | | | 715/781 |

FOREIGN PATENT DOCUMENTS

| | | |
|---|---|---|
| JP | 2007-081772 A | 3/2007 |
| JP | 2008-092515 A | 4/2008 |
| WO | 2013/164915 A1 | 11/2013 |
| WO | 2014/192152 A1 | 12/2014 |

OTHER PUBLICATIONS

May 17, 2016 Written Opinion issued in International Patent Application No. PCT/JP2016/060496.

Sep. 5, 2018 Extended European Search Report issued in European Patent Application No. 16773024.01.

Apr. 16, 2019 Office Action issued in Japanese Patent Application No. 2015-070439.

Aug. 1, 2019 Office Action issued in Chinese Patent Application No. 201680015824.3.

Dec. 2, 2019 Office Action issued in Indian Patent Application No. 201717034609.

* cited by examiner

ELECTRONIC DEVICE AND COMPUTER PROGRAM PRODUCT FOR SETTING IMAGE CAPTURING CONDITIONS FOR MULTIPLE REGIONS IN IMAGE CAPTURING SENSOR

TECHNICAL FIELD

The present invention relates to an electronic device and a computer program product.

BACKGROUND ART

PTL1 discloses an image-capturing apparatus having an image sensor that can be able to set image-capturing conditions for each of regions in a screen.

CITATION LIST

Patent Literature

PTL1: Japanese Laid-Open Patent Publication No. 2006-49361

SUMMARY OF INVENTION

Technical Problem

The prior art has a difficulty in setting image-capturing conditions for each region.

Solution to Problem

According to the 1st aspect of the present invention, an electronic device comprises: an image-capturing unit that captures an image of a subject with an image sensor, the image sensor being configured to be able to set image-capturing conditions for a plurality of regions on an image-capturing surface; and a control unit that determines the image-capturing conditions varied for each of the regions, based on a subject element detected from the image captured by the image-capturing unit.

According to the 2nd aspect of the present invention, in the electronic device according to the 1st aspect, it is preferred that the control unit determines the image-capturing conditions, based on the subject element and a preset image-capturing mode.

According to the 3rd aspect of the present invention, in the electronic device according to the 1st or 2nd aspect, it is preferred that the electronic device further comprises an image processing unit that generates a candidate image by varying the image-capturing conditions determined by the control unit, in at least one of the plurality of regions.

According to the 4th aspect of the present invention, in the electronic device according to the 3rd aspect, it is preferred that the image processing unit generates a plurality of candidate images having varying stages of the image-capturing conditions.

According to the 5th aspect of the present invention, in the electronic device according to the 4th aspect, it is preferred that: the image-capturing conditions are at least one of luminance and chroma; and the image processing unit generates the plurality of candidate images having varying stages of luminance or chroma.

According to the 6th aspect of the present invention, in the electronic device according to the 5th aspect, it is preferred that the image processing unit generates the captured image before a change in the image-capturing conditions for each of the regions as a reference image and also generates the candidate image after the change in the image-capturing conditions for each of the regions.

According to the 7th aspect of the present invention, in the electronic device according to the 6th aspect, it is preferred that the image processing unit generates the reference image and an image having a luminance different from that of the reference image.

According to the 8th aspect of the present invention, in the electronic device according to the 6th or 7th aspect, it is preferred that the image processing unit generates the reference image and an image having a chroma different from that of the reference image.

According to the 9th aspect of the present invention, in the electronic device according to any one of the 3rd to 8th aspects, it is preferred that the electronic device further comprises a display unit that displays the candidate image or the candidate images.

According to the 10th aspect of the present invention, in the electronic device according to the 9th aspect, it is preferred that the electronic device further comprises a setting unit that sets the image-capturing conditions for the candidate image in the image-capturing surface corresponding to the candidate image, if an operation of selecting the candidate image displayed on the display unit is performed.

According to the 11th aspect of the present invention, in the electronic device according to the 9th aspect, it is preferred that the electronic device further comprises a display control unit that displays a region representing an image created under the image-capturing conditions varied by the image processing unit, among the plurality of regions, in a manner different from other regions on the display unit.

According to the 12th aspect of the present invention, a computer program product causes a computer to execute: an image-capturing process of capturing an image of a subject with an image sensor, the image sensor being configured to be able to set image-capturing conditions for a plurality of regions on an image-capturing surface; and a determining process of determining the image-capturing conditions varied for each of the regions, based on a subject element detected from the image captured by the image-capturing unit.

DESCRIPTION OF EMBODIMENTS

<Description of Camera>

Figure 1:
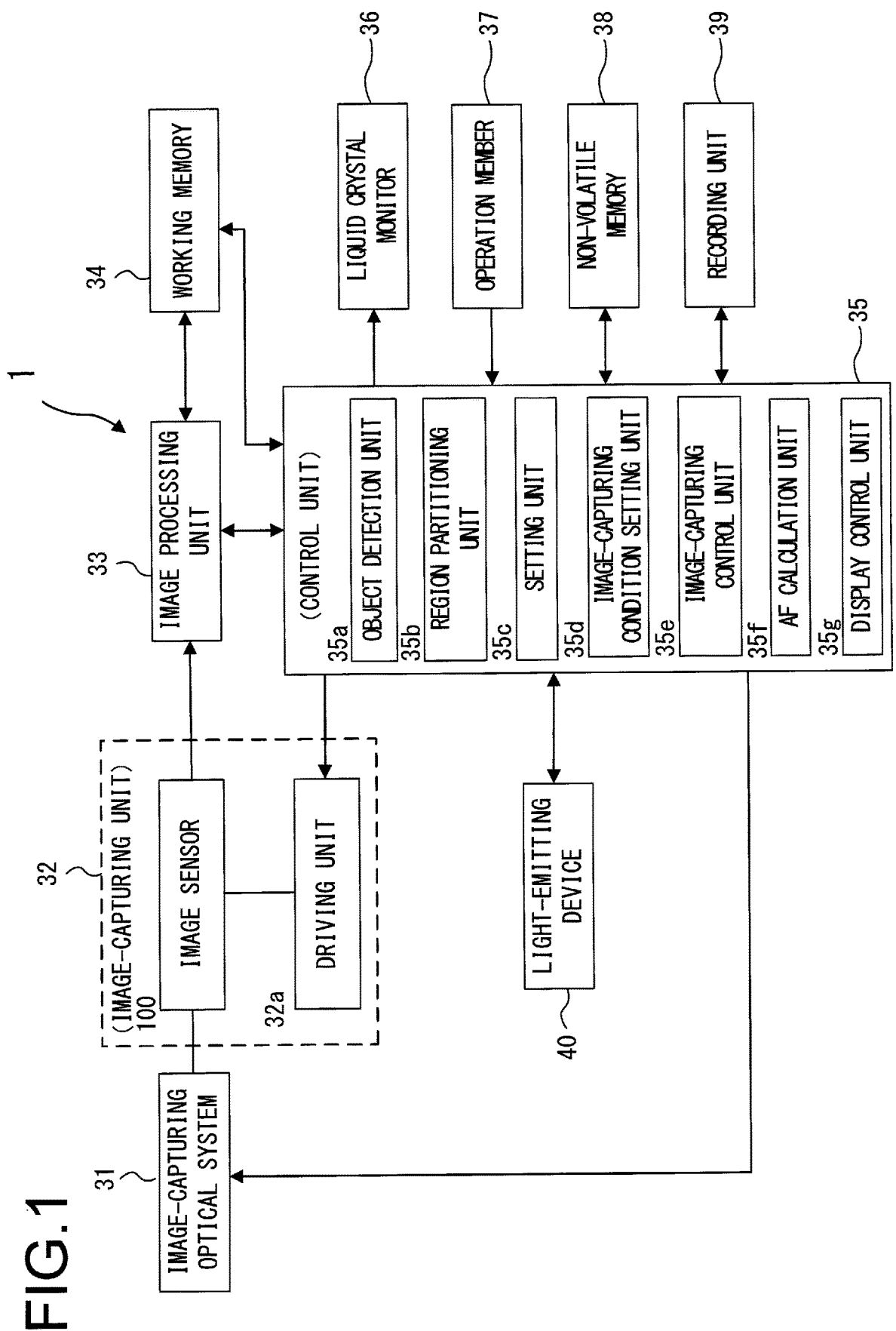
FIG. 1 is a block diagram illustrating a configuration of a camera according to an embodiment.

FIG. 1 is a block diagram illustrating a configuration of an electronic device (e.g., a camera 1) according to an embodiment. In FIG. 1, the camera 1 includes an image-capturing optical system 31, an image-capturing unit 32, an image processing unit 33, a working memory 34, a control unit 35, a liquid crystal monitor 36, an operation member 37, a non-volatile memory 38, a recording unit 39, and a light-emitting device 40.

The image-capturing optical system 31 directs light flux from a subject field to the image-capturing unit 32. The image-capturing unit 32 includes an image sensor 100 and a driving unit 32a and performs a photoelectric conversion on a subject image formed by the image-capturing optical system 31. The image-capturing unit 32 may capture images under the same conditions for all regions of the image-capturing surface in the image sensor 100 or under different conditions for different regions of the image-capturing surface in the image sensor 100. The image-capturing unit 32 will be described later in detail. The driving unit 32a generates a driving signal required to cause the image sensor 100 to control charge storage. An image-capturing instruction for the image-capturing unit 32 including a charge storage time is transmitted from the control unit 35 to the driving unit 32a.

The image processing unit 33 cooperates with the working memory 34 to perform image processing on image data captured by the image-capturing unit 32. The image processing includes, for example, contour enhancement processing, gamma correction, white balance adjustment, display luminance adjustment, and chroma adjustment. The image processing unit 33 may perform image processing by applying the same parameters and the like for all regions of the image or applying different parameters and the like for different regions of the image, as described later.

The working memory 34 is a memory that temporarily records image data before and after image processing and other data. The control unit 35, which is composed of a CPU or the like, controls the overall operation of the camera 1. For example, the control unit 35 performs a predetermined exposure calculation on the basis of an image signal acquired by the image-capturing unit 32 to determine exposure conditions such as a charge storage time (an exposure time) of the image sensor 100, an aperture value of the image-capturing optical system 31, and an ISO sensitivity which are required for a correct exposure. The control unit 35 then sends an instruction to the driving unit 32a. The control unit 35 also determines image processing conditions which adjust chroma, contrast, sharpness, and the like in accordance with a scene capture mode set in the camera 1 and a type of a detected subject element. The control unit 35 then sends an instruction to the image processing unit 33. The detection of the subject element will be described later. Further, if the setting causes the light-emitting device 40 to emit light, the control unit 35 determines a light-emitting amount of the light-emitting device 40 which is required for a correct exposure. The control unit 35 then sends an instruction to the light-emitting device 40.

The control unit 35 includes an object detection unit 35a, a region partitioning unit 35b, a setting unit 35c, an image-capturing condition setting unit 35d, an image-capturing control unit 35e, an AF calculation unit 35f, and a display control unit 35g. These units may be embodied in software by the control unit 35 executing programs stored in the non-volatile memory 38. Alternatively, the units may be composed of ASICs or the like.

The object detection unit 35a performs known object recognition processing to detect subject elements from the image captured by the image-capturing unit 32, such as persons (faces of persons), animals (faces of animals) such as dogs or cats, plants, vehicles such as bicycles, automobiles, or trains, buildings, stationary objects, landscape elements such as mountains or clouds, and predetermined specific objects.

The region partitioning unit 35b divides (partitions) a screen captured by the image-capturing unit 32 into a plurality of regions including the subject elements detected as described above. The setting unit 35c ranks the plurality of regions partitioned by the region partitioning unit 35b. A way of ranking will be described later.

The image-capturing condition setting unit 35d sets image-capturing conditions for the plurality of regions partitioned by the region partitioning unit 35b. The image-capturing conditions include the exposure conditions (e.g., charge storage time, gain, ISO sensitivity, frame rate) and the image processing conditions (e.g., white balance adjustment parameters, gamma correction curves, display luminance adjustment parameters, chroma adjustment parameters). It should be noted that the same image-capturing conditions may be set for all of the plurality of regions or image-capturing conditions may be set to be varied for the plurality of regions.

The image-capturing control unit 35e controls the image-capturing unit 32 (the image sensor 100) and the image processing unit 33 by applying the image-capturing conditions set by the image-capturing condition setting unit 35d for each region. This allows the image-capturing unit 32 to capture images under varying exposure conditions for the plurality of regions partitioned by the region partitioning unit 35b, and also allows the image processing unit 33 to perform image processing under varying image processing conditions for the plurality of regions partitioned by the region partitioning unit 35b.

The AF calculation unit 35f performs an automatic focus adjustment (autofocus: AF) calculation for focusing on a corresponding subject at a predetermined position (referred to as a focus point) in the captured screen. Based on the AF calculation result, the AF calculation unit 35f transmits a driving signal for shifting a focus lens of the image-capturing optical system 31 to a position where the focus lens focuses on the subject. It should be noted that the AF scheme may be a contrast detection scheme or a phase detection (or phase difference detection) scheme.

The display control unit 35g controls display of an image to be displayed on a liquid crystal monitor 36. The display control unit 35g may display one image on the display surface of the liquid crystal monitor 36 or may display a plurality of images arranged vertically and horizontally on the display surface of the liquid crystal monitor 36, for example. The display control unit 35g further allows images displayed on the display surface of the liquid crystal monitor 36 to be scrolled in response to a user operation.

The liquid crystal monitor 36 reproduces and displays images processed by the image processing unit 33 or images read out by the recording unit 39. The liquid crystal monitor 36 also displays an operation menu screen, a setting screen for setting image-capturing conditions, and other screens.

The operation member 37 includes a variety of operation members, such as a shutter release button and menu buttons. The operation member 37 transmits an operation signal corresponding to each operation to the control unit 35. The operation member 37 also includes a touch operation member provided on the display surface of the liquid crystal monitor 36.

The non-volatile memory 38 records the programs to be executed by the control unit 35 and the like. The recording unit 39 records image data and the like in a recording medium composed of a memory card (not shown) or the like, in response to an instruction from the control unit 35. The recording unit 39 also reads out the image data recorded in the recording medium, in response to an instruction from the control unit 35.

The light-emitting device 40 is an auxiliary photographing light source for illuminating a subject. If the setting causes the light-emitting device 40 to emit light, for example, the light-emitting device 40 emits light having a light amount specified by the control unit 35, in response to a light-emitting instruction from the control unit 35.

<Description of Stacked Image Sensor>

Figure 2:
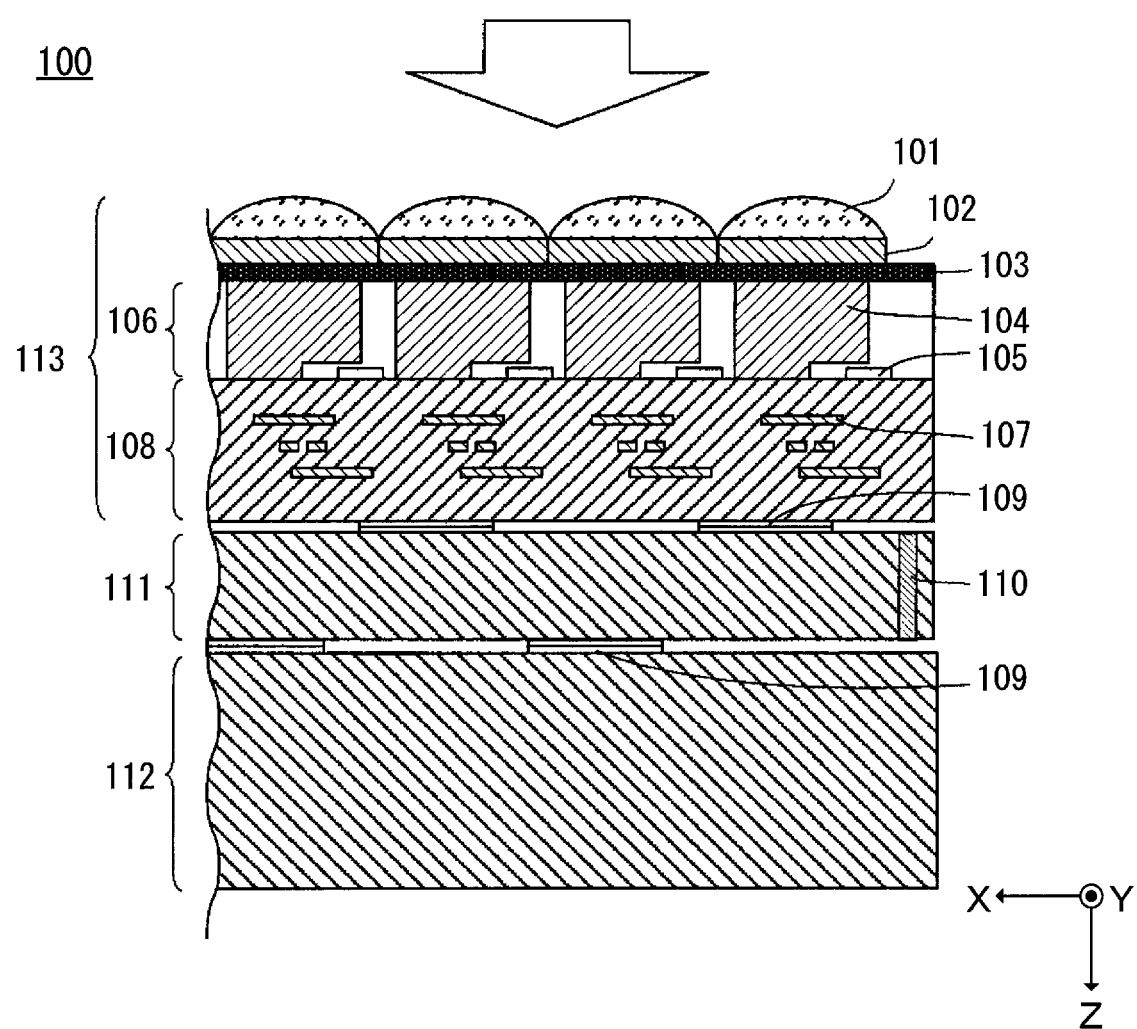
FIG. 2 is a cross-sectional view of a stacked image sensor.

A stacked image sensor 100 provided in the above-described camera 1 will be described. International Publication WO13/164915, which was previously filed by the present applicants and has been published, discloses the stacked image sensor 100. FIG. 2 is a cross-sectional view of the stacked image sensor 100. The image sensor 100 includes a back-side illumination image-capturing chip 113 that outputs pixel signals corresponding to incident light, a signal processing chip 111 that processes the pixel signals, and a memory chip 112 that records the pixel signals. The image-capturing chip 113, the signal processing chip 111, and the memory chip 112 are stacked and electrically connected to one another with conductive bumps 109, which are made of Cu, for example.

It should be noted that the incident light is incident mainly in a positive Z-axis direction which is denoted by a white arrow, as illustrated in FIG. 2. In this embodiment, a surface of the image-capturing chip 113 on which the incident light is incident is referred to as a back surface (an image-capturing surface). Furthermore, a direction toward the left on the paper plane orthogonal to the Z axis will be defined as a positive X-axis direction, and a direction toward the front side of the paper plane orthogonal to the Z axis and the X axis will be defined as a positive Y-axis direction, as denoted by the coordinate axes. Some of the following figures illustrate coordinate axes with reference to the coordinate axes in FIG. 2 to clarify the orientation of the figures.

An example of the image-capturing chip 113 is a back-side illumination MOS image sensor. A PD layer 106 is arranged on the back surface side of a wiring layer 108. The PD layer 106 includes a plurality of PDs (photodiodes) 104 that are two-dimensionally arranged and store charges in accordance with incident light, and transistors 105 that are provided in a manner corresponding to the PDs 104.

On the side of the PD layer 106 on which the incident light is incident, color filters 102 are arranged with a passivation film 103 between the PD layer 106 and the color filters 102. The color filters 102 include a number of types of filters transmitting different wavelength ranges and have a specific arrangement in a manner corresponding to the PDs 104. The arrangement of the color filters 102 will be described later. A color filter 102, a PD 104, and a transistor 105 together form one pixel.

On the side of the color filter 102 on which incident light is incident, a microlens 101 is provided in a manner corresponding to each pixel. The microlens 101 focuses the incident light onto the corresponding PD 104.

The wiring layer 108 has a wiring line 107 that transmits the pixel signal from the PD layer 106 to the signal processing chip 111. The wiring line 107 may be multilayered and may also be provided with passive elements and active elements.

A plurality of bumps 109 are disposed on a surface of the wiring layer 108. The plurality of bumps 109 are aligned with a plurality of bumps 109 provided on a surface of the signal processing chip 111 opposing to the wiring layer 108. The aligned bumps 109 are then joined and electrically connected to each other by a pressure applied on the image-capturing chip 113 and the signal processing chip 111 or by other measures.

Similarly, a plurality of bumps 109 are disposed on opposing surfaces of the signal processing chip 111 and the memory chip 112. These bumps 109 are aligned with each other. The aligned bumps 109 are then joined and electrically connected to each other by a pressure applied on the signal processing chip 111 and the memory chip 112 or by other measures.

It should be noted that the bonding of the bumps 109 is not limited to Cu bump bonding by solid phase diffusion. Microbump bonding by solder melting may be employed. Additionally, only approximately one bump 109 is required for each of blocks which will be described later, for example. The size of the bump 109 may thus be larger than the pitch of the PD 104. In a peripheral region other than the pixel region where the pixels are arranged, bumps that are larger than the bumps 109 corresponding to the pixel region may also be provided together.

The signal processing chip 111 has a TSV (through-silicon via) 110 that connects a circuit provided on the front surface to a circuit provided on the back surface of the signal processing chip 111. The TSV 110 is preferably provided in the peripheral region. The TSV 110 may also be provided in the peripheral region of the image-capturing chip 113 or in the memory chip 112.

Figure 3:
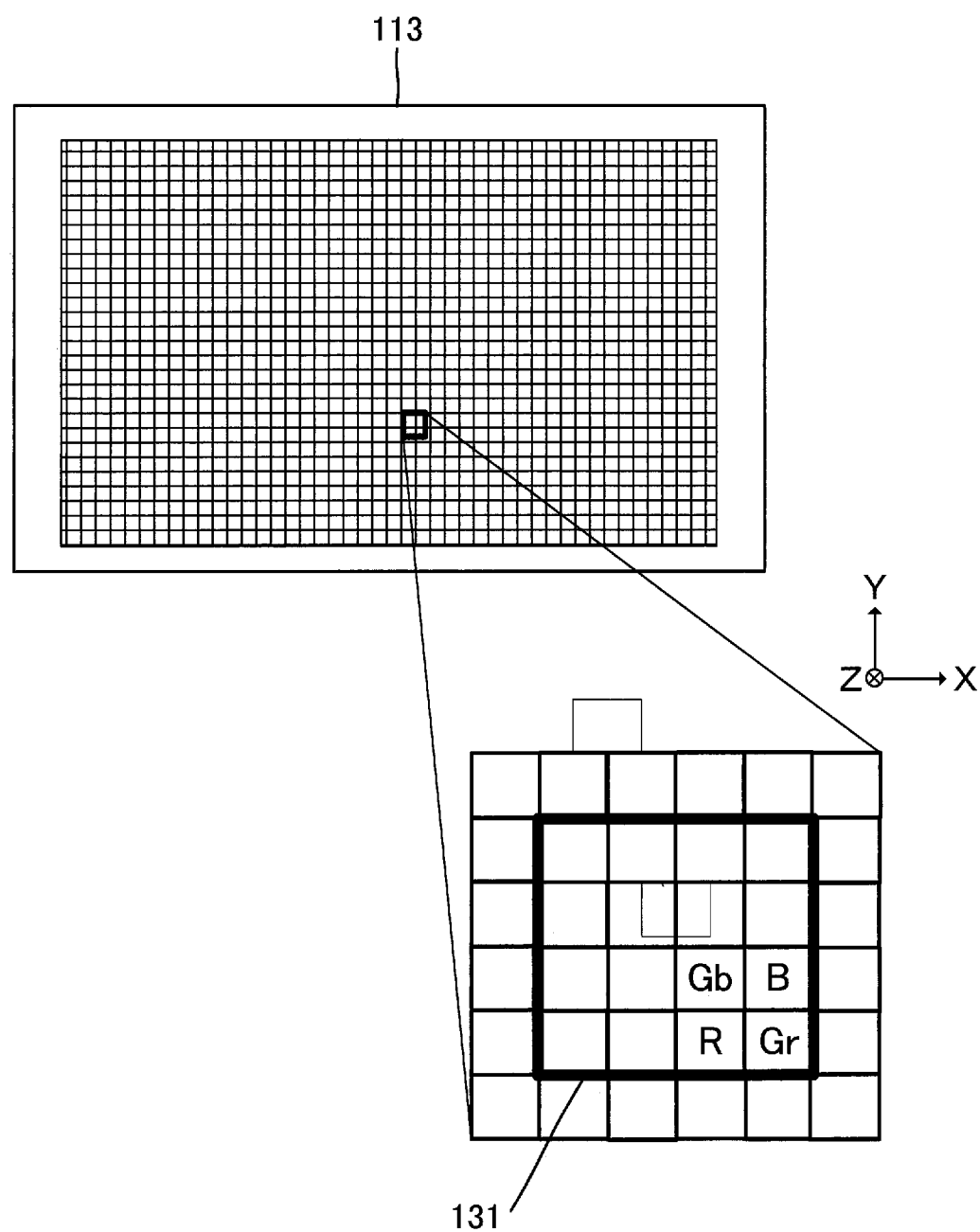
FIG. 3 is a view for explaining a pixel arrangement and a unit region of an image-capturing chip.

FIG. 3 is a view for explaining a pixel arrangement and an unit region 131 of the image-capturing chip 113. Specifically, FIG. 3 illustrates the image-capturing chip 113 as seen from the back surface (image-capturing surface) side. The pixel region has, for example, 20 million or more pixels that are arranged in a matrix. In the example in FIG. 3, sixteen adjacent pixels (i.e., 4×4 pixels) form one unit region 131. Grid lines in the figure illustrate how adjacent pixels are grouped to form the unit region 131. The number of pixels forming the unit region 131 is not limited to this value. Alternatively, approximately 1000 pixels may be used, such as 32×64 pixels or more or less.

As illustrated in a partial enlarged view of the pixel region, the unit region 131 in FIG. 3 includes four (upper and lower, right and left) so-called Bayer arrangements, each consisting of four pixels: green pixels Gb, Gr, a blue pixel B, and a red pixel R. The green pixel Gb or Gr having a green filter as its color filter 102 receives light in a green wavelength band of incident light. Similarly, the blue pixel B having a blue filter as its color filter 102 receives light in a blue wavelength band, and the red pixel R having a red filter as its color filter 102 receives light in a red wavelength band.

In this embodiment, a plurality of blocks are defined so that each block includes at least one unit region 131. Each block can control pixels included therein with its own control parameters. In other words, image-capturing signals indicating varying image-capturing conditions can be acquired for a pixel group included in one block and a pixel group included in another block. The control parameters include, for example, frame rate, gain, subsampling rate, the number of rows or columns for addition of the pixel signals, charge storage time or the number of charge storage events, and the number of bits (a word length) in digitization. The image sensor 100 is free to perform subsampling not only in the row direction (the X-axis direction of the image-capturing chip 113), but also in the column direction (the Y-axis direction of the image-capturing chip 113). The control parameters may also be parameters in the image processing after the acquisition of the image signal from the pixel.

Figure 4:
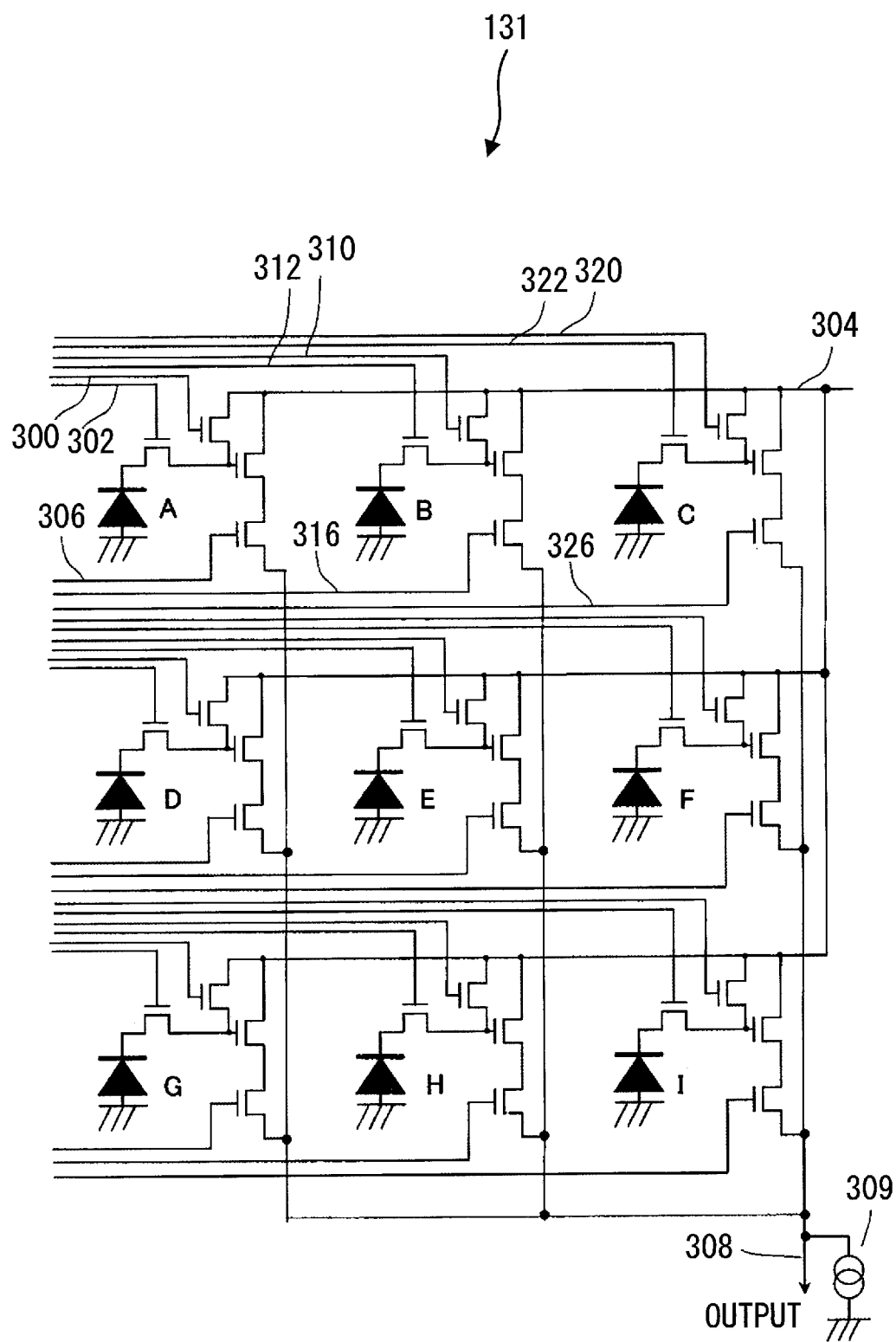
FIG. 4 is a diagram illustrating a circuit in the unit region.

FIG. 4 is a view for explaining a circuit in the unit region 131. In the example in FIG. 4, nine adjacent pixels (i.e., 3×3 pixels) form one unit region 131. As described above, the number of pixels included in the unit region 131 is not limited to this value. More or less pixels may be used. Symbols A to I denote two-dimensional positions in the unit region 131.

Reset transistors for pixels included in the unit region 131 can be individually turned on and off. In FIG. 4, a reset wiring line 300 for turning on and off the reset transistor of the pixel A is provided, and a reset wiring line 310 for turning on and off the reset transistor of the pixel B is provided separately from the reset wiring line 300. Similarly, a reset wiring line 320 for turning on and off the reset transistor of the pixel C is provided separately from the reset wiring lines 300 and 310. Other pixels D to I are also provided with their own reset wiring lines for turning on and off their reset transistors.

Transfer transistors for pixels included in the unit region 131 can also be individually turned on and off. In FIG. 4, a transfer wiring line 302 for turning on and off the transfer transistor of the pixel A, a transfer wiring line 312 for turning on and off the transfer transistor of the pixel B, and a transfer wiring line 322 for turning on and off the transfer transistor of the pixel C are separately provided. Other pixels D to I are also provided with their own transfer wiring lines for turning on and off their transfer transistors.

Selection transistors for pixels included in the unit region 131 can also be individually turned on and off. In FIG. 4, a selection wiring line 306 for turning on and off the selection transistor of the pixel A, a selection wiring line 316 for turning on and off the selection transistor of the pixel B, and a selection wiring line 326 for turning on and off the selection transistor of the pixel C are separately provided. Other pixels D to I are also provided with their own selection wiring lines for turning on and off their selection transistors.

It should be noted that a power supply wiring line 304 is shared between the pixels A to I included in the unit region 131. Similarly, an output wiring line 308 is shared between the pixels A to I included in the unit region 131. While the power supply wiring line 304 is shared between a plurality of unit regions, the output wiring line 308 is provided separately for each unit region 131. A load current source 309 supplies an electric current to the output wiring line 308. The load current source 309 may be provided in the image-capturing chip 113 or in the signal processing chip 111.

Individually turning on and off the reset transistors and the transfer transistors of the unit region 131 allows control of charge storage parameters including a charge storage start time, a charge storage end time, and a transfer timing for the pixels A to I included in the unit region 131. Additionally, individually turning on and off the selection transistors of the unit region 131 allows output of pixel signals of the pixels A to I through the shared output wiring line 308.

In this context, a so-called rolling shutter scheme is known, in which charge storage is controlled in a regular order in rows and columns for pixels A to I included in the unit region 131. In the rolling shutter scheme, a row of the pixels may be selected and then a column may be designated, so that the pixel signals for the pixels are output in order of "ABCDEFGHI" in the example in FIG. 4.

A configuration of the circuit composed of the unit regions 131 in this way allows the charge storage time to be controlled for each unit region 131. In other words, pixel signals can be output at different frame rates for different unit regions 131. Furthermore, the charge storage (the image-capturing) is performed in unit regions 131 included in some blocks in the image-capturing chip 113, while it is disabled in unit regions 131 included in other blocks. This may result in image-capturing and output of pixel signals only in predetermined blocks of the image-capturing chip 113. Additionally, blocks in which the charge storage (the image-capturing) is to be performed (i.e., blocks targeted for the charge control) may be switched from one frame to another, so that images are captured and pixel signals are output sequentially in different blocks of the image-capturing chip 113.

Figure 5:
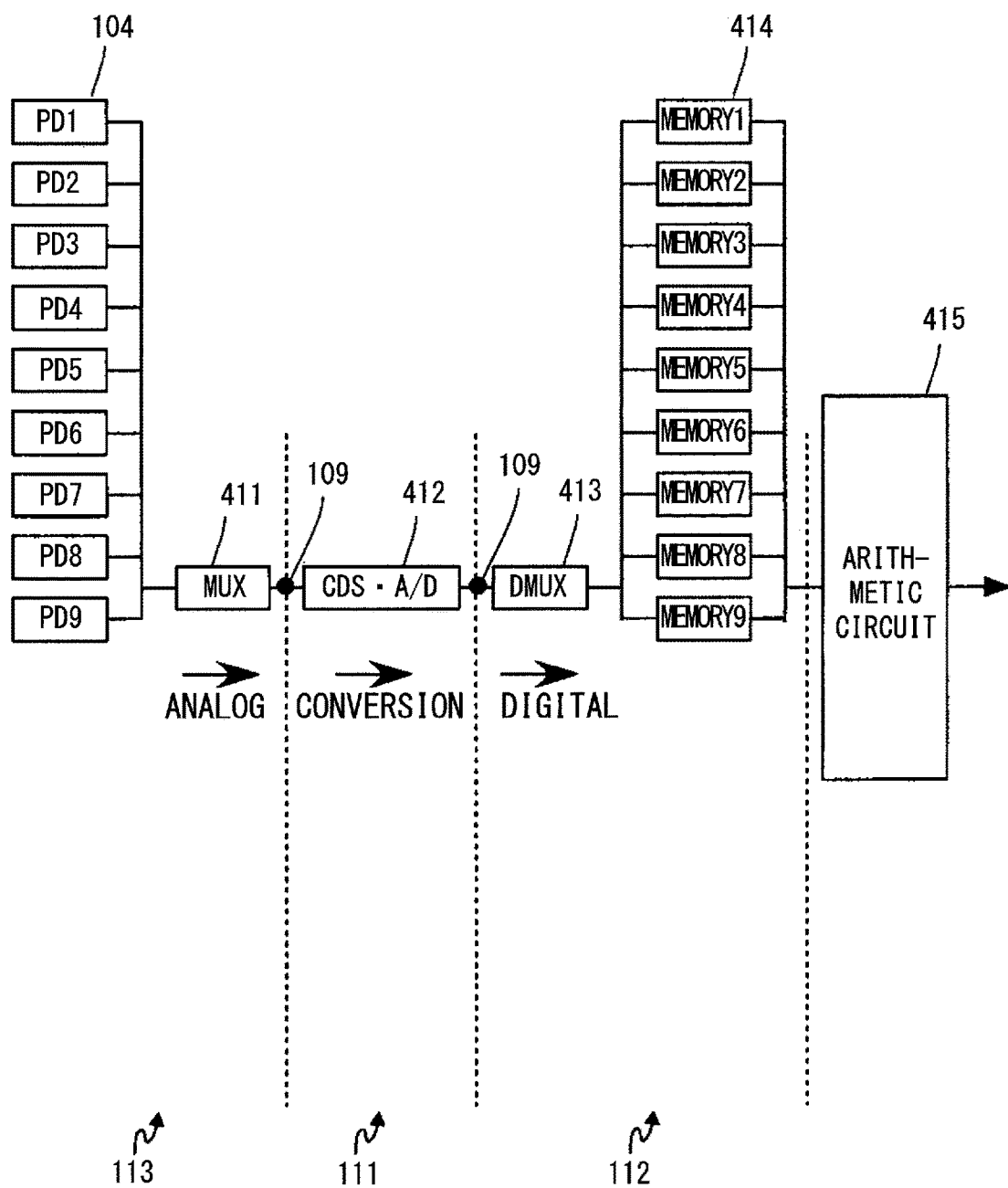
FIG. 5 is a block diagram illustrating a functional configuration of an image sensor corresponding to the circuit in FIG. 4.

FIG. 5 is a block diagram illustrating a functional configuration of the image sensor 100 corresponding to the circuit illustrated in FIG. 4. An analog multiplexer 411 sequentially selects nine PDs 104 forming the unit region 131 to output a pixel signal for each PD 104 to the output wiring line 308 provided in a manner corresponding to the unit region 131. The multiplexer 411 is formed on the image-capturing chip 113, together with the PDs 104.

The pixel signal outputted via the multiplexer 411 is subjected to correlated double sampling (CDS) and analog-to-digital (A/D) conversion in the signal processing circuit 412, which is formed in the signal processing chip 111 to perform the CDS and A/D conversion. The A/D converted pixel signal is delivered to a demultiplexer 413 and then stored in a pixel memory 414 corresponding to each pixel. The demultiplexer 413 and the pixel memories 414 are formed in the memory chip 112.

The arithmetic circuit 415 processes the pixel signal stored in the pixel memory 414 and delivers the processed pixel signal to the image processing unit that follows the arithmetic circuit 415. The arithmetic circuit 415 may be provided in the signal processing chip 111 or in the memory chip 112. Although FIG. 5 illustrates only the connection configuration for one unit region 131, such configurations are individually provided for unit regions 131 and operate in parallel, in practice. However, the arithmetic circuit 415 may not be provided for each unit region 131. For example, one arithmetic circuit 415 may sequentially reference and process values of the pixel memories 414 corresponding to individual unit regions 131.

As described above, the output wiring line 308 is provided in a manner corresponding to each unit region 131. Electrical connections between the chips with the bumps 109 may be used for the output wiring lines 308, which enables routing of the wiring lines without increasing the extent of the chips in the plane direction, since the image-capturing chip 113, the signal processing chip 111, and the memory chip 112 are stacked in the image sensor 100.

<Setting of Image-Capturing Conditions for Each Region>

This embodiment allows setting of image-capturing conditions for each of a plurality of blocks in the image sensor 100 (the image-capturing chip 113). The control unit 35 correlates the regions partitioned by the region partitioning unit 35*b* to the blocks to capture an image under image-capturing conditions setting for the individual regions.

A user sets image-capturing conditions for a desired region while viewing a live view image displayed on the display surface of the liquid crystal monitor 36, for example. The live view image refers to an image for monitoring that is repeatedly captured at a predetermined frame rate (e.g., 60 fps).

When the user sets (changes) image-capturing conditions for a region, the control unit 35 causes the image processing unit 33 to perform image processing on the region in the live view image. The image processing performed here is image processing for observing the effects due to changes in the image-capturing conditions. For example, if the image-capturing conditions are changed to increase the luminance, image processing is performed for increasing the display luminance on the liquid crystal monitor 36. Furthermore, if the image-capturing conditions are changed to cause the light-emitting device 40 to emit light, for example, image processing is performed for increasing the display luminance on the liquid crystal monitor 36 for a predetermined subject element (for example, a person). Furthermore, if the image-capturing conditions are changed to increase the chroma, for example, image processing is performed for increasing the chroma for a predetermined subject element (for example, a flower) displayed on the liquid crystal monitor 36. In this way, the user can observe the effects due to the changes in the image-capturing conditions while viewing the processed live view images, before actual image-capturing. The setting of image-capturing conditions for each region will be described below in detail. It should be noted that the embodiment is not limited to the method of processing images and displaying the processed images on the liquid crystal monitor 36 to observe the effects due to the changes in the image-capturing conditions for the region. Alternatively, a method may be used which reflects the change in the image-capturing conditions for a region onto the image sensor corresponding to the region and displays a live view image under the set (changed) image-capturing conditions on the liquid crystal monitor 36.

Figure 6:
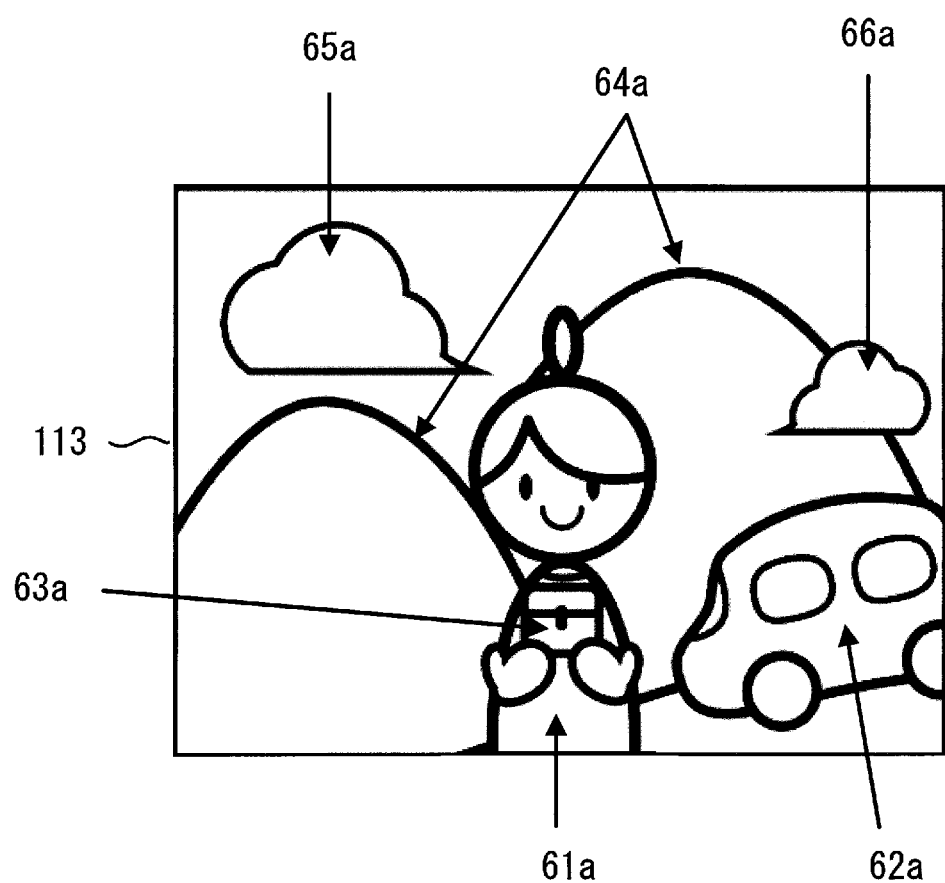
FIG. 6 is a view schematically illustrating an image of a subject formed on an image sensor of a camera.

FIG. 6 is a view schematically illustrating a subject image formed on the image sensor 100 of the camera 1. The camera 1 photoelectrically converts the subject image into a live view image, before an image-capturing instruction is provided.

The control unit 35 first sets the same image-capturing conditions for all regions of the image-capturing chip 113 (i.e., the entire image-capturing surface). The exposure conditions of the image-capturing conditions are determined based on exposure conditions calculated so as to achieve a correct exposure in accordance with a photometric value of a subject luminance, or based on exposure conditions manually set by the user. The image processing conditions of the image-capturing conditions are determined to be image processing conditions prepared in advance to provide a standard image quality. The image-capturing conditions determined in this way are hereinafter referred to as reference conditions. An image obtained with the use of the reference conditions is referred to as a reference image.

An example of determining the reference conditions will be described. The control unit 35 selects one of a "program auto" mode, a "shutter speed priority auto" mode, an "aperture priority auto" mode, and a "manual" mode, in accordance with an operation signal from an exposure mode changeover switch constituting the operation member 37. The control unit 35 then performs a predetermined exposure calculation according to the selected exposure mode to calculate the exposure conditions (charge storage time, gain, ISO sensitivity, frame rate, and the like) described above.

Specifically, in the case of the "program auto" mode, the control unit 35 determines an aperture value, a shutter speed (a charge storage time), a gain, and the like so that the average luminance in the screen is appropriate, for example. In the case of the "shutter speed priority auto" mode, the control unit 35 uses the shutter speed (the charge storage time) set by the user to determine the aperture value, the gain, and the like so that the average luminance in the screen is appropriate, for example. In the case of the "aperture priority auto" mode, the control unit 35 uses the aperture value set by the user to determine the shutter speed (the charge storage time), the gain, and the like so that the average luminance in the screen is appropriate, for example. In the case of the "manual" mode, the control unit 35 calculates a deviation from the correct exposure based on the aperture value and the shutter speed (the charge storage time) set by the user.

In FIG. 6, an image including a person 61*a*, an automobile 62*a*, a bag 63*a*, a mountain 64*a*, and clouds 65*a* and 66*a* is formed on the image-capturing surface of the image-capturing chip 113. The person 61*a* holds the bag 63*a* in both hands. Behind and right of the person 61*a*, the automobile 62*a* is parked.

<Region Partitioning>

Based on the live view image, the control unit 35 partitions an image captured as a live view image into a plurality of regions in the following way. First, subject elements are detected from the live view image by the object detection unit 35*a*. Any of known subject recognition technologies is employed for the detection of the subject elements. In the example in FIG. 6, the object detection unit 35*a* detects the person 61*a*, the automobile 62*a*, the bag 63*a*, the mountain 64*a*, the cloud 65*a*, and the cloud 66*a* as the subject elements.

Next, the region partitioning unit 35*b* partitions the image captured as the live view image into regions including the subject elements, based on the above-described detecting measure. In this example, for the sake of explanation, a region including the person 61*a* will be defined as a first region 61, a region including the automobile 62*a* as a second region 62, a region including the bag 63*a* as a third region 63, a region including the mountain 64*a* as a fourth region 64, a region including the cloud 65*a* as a fifth region 65, and a region including the cloud 66*a* as a sixth region 66.

The setting unit 35*c* ranks the plurality of regions partitioned by the region partitioning unit 35*b*. If the setting unit 35*c* detects the following regions (1) to (4) among the regions partitioned by the region partitioning unit 35*b*, the setting unit 35c sets these regions as regions having higher priorities for changing image-capturing conditions than those of other regions partitioned by the region partitioning unit 35b.

(1) A Region in which a Specific Subject Corresponding to a Scene Capture Mode is Detected A specific subject depends on a preset scene capture mode of the camera 1. For example, if the preset scene capture mode of the camera 1 is a portrait mode, the setting unit 35c sets the first region 61 including the person 61a as a region having a higher priority for changing image-capturing conditions than those of the second region 62 including the automobile 62a, the third region 63 including the bag 63a, the fourth region 64 including the mountain 64a, the fifth region 65 including the cloud 65a, and the sixth region including the cloud 66a. This is based on the idea that image-capturing conditions for the first region 61 including the person 61a are likely to be set (changed) in the portrait mode.

For example, if the preset scene capture mode of the camera 1 is a close-up mode and a flower has been detected by the object detection unit 35a as a subject element, the setting unit 35c sets a region including the flower as a region having a higher priority for changing image-capturing conditions than those of other regions. This is based on the idea that image-capturing conditions for the region including the flower are likely to be set (changed) in the close-up mode.

For example, if the preset scene capture mode of the camera 1 is a landscape mode and a mountain has been detected by the object detection unit 35a as a subject element, the setting unit 35c sets a region including the mountain as a region having a higher priority for changing image-capturing conditions than those of other regions. This is based on the idea that image-capturing conditions for the region including the mountain are likely to be set (changed) in the landscape mode.

For example, if the preset scene capture mode of the camera 1 is a beach mode and the ocean has been detected by the object detection unit 35a as a subject element, the setting unit 35c sets a region including the ocean as a region having a higher priority for changing image-capturing conditions than those of other regions. This is based on the idea that image-capturing conditions for the region including the ocean are likely to be set (changed) in the beach mode.

For example, if the preset scene capture mode of the camera 1 is a sunset mode and red sky has been detected by the object detection unit 35a as a subject element, the setting unit 35c sets a region including the red sky as a region having a higher priority for changing image-capturing conditions than those of other regions. This is based on the idea that image-capturing conditions for the region including the red sky are likely to be set (changed) in the sunset mode.

For example, if the preset scene capture mode of the camera 1 is a cuisine mode and food served on a dish has been detected by the object detection unit 35a as a subject element, the setting unit 35c sets a region including the dish and the food as a region having a higher priority for changing image-capturing conditions than those of other regions. This is based on the idea that image-capturing conditions for the region including the food served on a dish are likely to be set (changed) in the cuisine mode.

The scene capture modes of the camera 1 described above may be set by the user operating the operation member 37 or by the control unit 37 on the basis of the subject elements detected from the screen of the live view image.

(2) A Region Including a Focused Subject Element

If the AF operation for focusing on the subject corresponding to the focus point as described above is performed, the setting unit 35c sets a region including the focused subject element (i.e., the subject element corresponding to the focus point) as a region having a higher priority for changing image-capturing conditions than those of regions including defocused subject elements. If no subject element is in focus, a region including a subject element having the smallest focus deviation amount (i.e., a subject element having the smallest distance from its position to a focus position) may be determined as a region having a higher priority for changing image-capturing conditions.

(3) a Region Including a Subject Element Having the Lowest Luminance or the Highest Luminance Among the plurality of subject elements detected by the object detection unit 35a, the setting unit 35c sets a region including the darkest or brightest subject element as a region having a higher priority for changing image-capturing conditions than those of other regions. This is based on the idea that image-capturing conditions for an excessively dark subject element such as a blocked-up shadow (clipped blacks) or an excessively bright subject element such as a blown-out highlight (clipped whites) are likely to be set (changed).

(4) a Region Including a Subject Element Having a High Proportion of a Certain Color Component Among the plurality of subject elements detected by the object detection unit 35a, the setting unit 35c sets a region including a subject element having a higher proportion of a color component of the green pixel Gb or Gr, the blue pixel B, or the red pixel R described above than those of other color components as a region having a higher priority for changing image-capturing conditions than those of other regions. This is based on the idea that image-capturing conditions for the region including a subject element having a color such as blue of sky, blue of ocean, green of mountain, or red of sunset are likely to be set (changed).

(5) A Region Including a Subject Element Closest to the Camera 1

The setting unit 35c determines a region including a subject element closest to the camera 1 as a region having a higher priority for changing image-capturing conditions than that of a region including a subject element further from the camera 1. For example, the control unit 35 acquires information concerning distances between the camera 1 and the partitioned subject elements and determines a region including a subject element closest to the camera 1. If no distance information is acquired, the control unit 35 may determine a region including a subject element occupying the largest proportion of the screen as a subject element closest to the camera 1.

If the setting unit 35c detects the following regions (6) to (10) among the regions partitioned by the region partitioning unit 35b, the setting unit 35c determines these regions as regions having lower ranks for changing image-capturing conditions than those of the above-described regions (1) to (5).

(6) a Region Including a Subject Element Having the Smallest Focus Deviation Amount If the AF operation for focusing on the subject corresponding to the focus point as described above is performed, the setting unit 35c sets a region including a subject element having the smallest focus deviation amount among regions except for a region including the focused subject element among the subject elements detected by the object detection unit 35a, as a region having a higher priority for changing image-capturing conditions than those of other regions. In general, the sharpness of the contour of a subject element increases as the focus deviation amount decreases. It can thus be said that a subject element having the contour with a higher sharpness has a smaller focus deviation amount. The setting unit 35c sets a region including a subject element having the contour with a higher sharpness as a region having a higher priority for changing image-capturing conditions than that of a region including a subject element having the contour with a lower sharpness.

First Example

In FIG. 6, for example, it is assumed that the AF calculation unit performs an AF operation on the first region 61 so that the person 61a is in focus. The setting unit 35c sets the third region 63 including a subject element having the smallest focus deviation amount (i.e., the bag 63a which is closest to the position of the person 61 in focus) among the automobile 62a, the bag 63a, the mountain 64a, the cloud 65a, and the cloud 66a, as a region having a second priority for changing image-capturing conditions, next to the first region 61 including the person 61a. This is based on the idea that image-capturing conditions for the third region 63 including the bag 63a are likely to be set (changed), next to the first region 61 including the person 61a.

Second Example

In FIG. 6, for example, it is assumed that the AF calculation unit focuses on a point between the person 61a and the automobile 62a. The setting unit 35c sets the second region 62 including a subject element having the smallest focus deviation amount (i.e., the automobile 62a which is closest to the position in focus) among the automobile 62a, the bag 63a, the mountain 64a, the cloud 65a, and the cloud 66a, as a region having a second priority for changing image-capturing conditions, next to the first region 61 including the person 61a. This is based on the idea that image-capturing conditions for the second region 62 including the automobile 62a are likely to be set (changed), next to the first region 61 including the person 61a.

(7) A Region Including a Subject Element Having a Small Difference in Distance

The setting unit 35c ranks the subject elements on the basis of differences in distances between the camera 1 and the subject elements. In FIG. 6, for example, it is assumed that an AF operation is performed on the first region 61 so that the person 61a is in focus. In this case, the setting unit 35c sets a region including a subject element having a distance from the camera 1 closer to a distance between the camera 1 and the person 61a (i.e., a smaller difference between the distances), among the automobile 62a, the bag 63a, the mountain 64a, the cloud 65a, and the cloud 66a, as a region having a higher priority for changing image-capturing conditions.

(8) a Region Including a Subject Element Having a Large Difference in Luminance

In FIG. 6, for example, it is assumed that an AF operation is performed on the first region 61 so that the person 61a is in focus. The setting unit 35c sets a region including a subject element having the largest difference between its luminance and the luminance of the person 61a, among the automobile 62a, the bag 63a, the mountain 64a, the cloud 65a, and the cloud 66a, as a region having a second priority for changing image-capturing conditions, next to the first region 61 including the person 61a. For example, if the mountain 64a is the subject element having the largest difference between its luminance and the luminance of the person 61a, the setting unit 35c sets the fourth region including the mountain 64a as a region having a second priority for changing image-capturing conditions, next to the first region 61 including the person 61a. This is based on the idea that image-capturing conditions for a region including a subject element having a large difference between its luminance and the luminance of the person 61a are likely to be set (changed).

(9) a Region Including a Large Subject Element

If the magnitude of the difference between the focus deviation amounts of the regions including the subject elements is insufficient and the magnitude of the difference between the luminances of the regions is also insufficient, the setting unit 35c assigns a higher rank for changing image-capturing conditions to a region including a subject element that is larger than other subject elements, that is, a region that occupies a larger area in the screen.

(10) a Region Including a Subject Element Close to the Center of the Screen

If the magnitude of the difference between the focus deviation amounts of the regions including the subject elements is insufficient and the magnitude of the difference between the luminances of the regions is also insufficient, the setting unit 35c assigns a higher rank to a region including a subject element closer to the center of the screen.

In this embodiment, one of the above-described regions (6) to (10) may be selected in advance by the user operating the operation member 37. Some of the regions (6) to (10) may also be combined.

In accordance with the procedures described above, the setting unit 35c ranks the second region 63 to the sixth region 66. For example, the second region 62 including the automobile 62a, which is a large subject element, is defined as a second-ranked region, the third region 63 including the bag 63a as a third-ranked region, the fourth region 64 including the mountain 64a as a fourth-ranked region, the fifth region 65 including the cloud 65a as a fifth-ranked region, and the sixth region 66 including the cloud 66a as a sixth-ranked region.

The setting unit 35c regards regions having no ranks even after the procedures for the conditions (6) to (10) described above, as regions having the same rank.

<Setting of Image-Capturing Conditions for Region>

Figure 7:
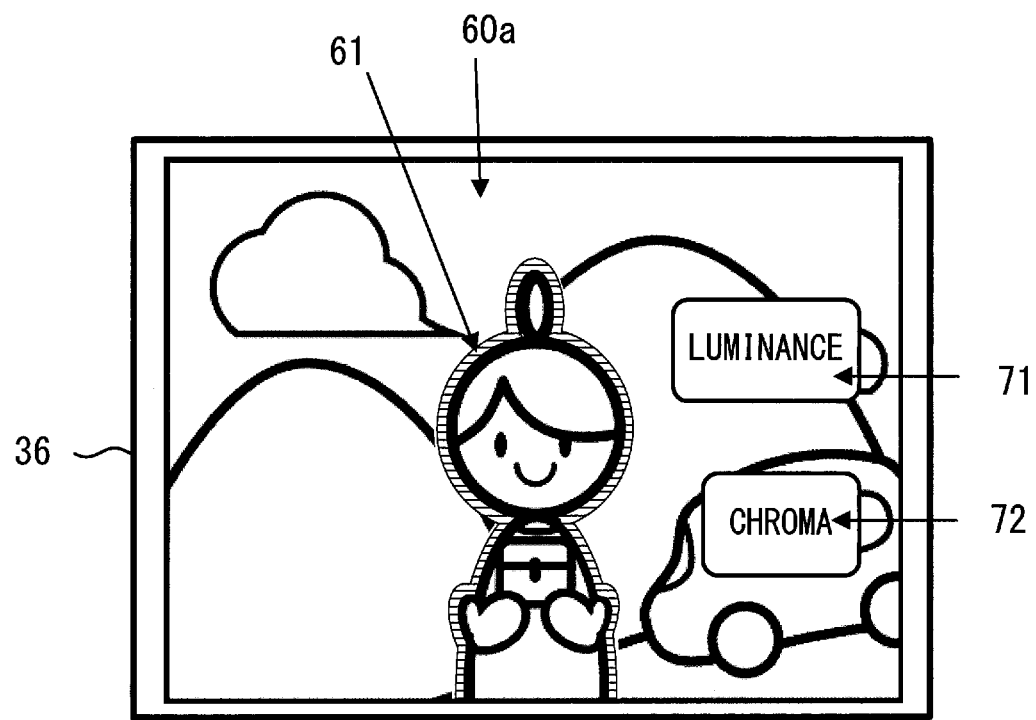
FIG. 7 is a view illustrating a setting screen for image-capturing conditions.

Once the region partitioning unit 35b partitions the screen into the plurality of regions, the control unit 35 displays a setting screen as illustrated in FIG. 7 on the liquid crystal monitor 36. In FIG. 7, a live view image 60a is displayed and also icons 71 and 72 are displayed, superimposed on the live view image 60a. The live view image 60a is a reference image obtained with the use of the above-mentioned reference conditions.

The icon 71 is an operation icon for selecting "luminance" as an example of setting items of the image-capturing conditions. The icon 72 is an operation icon for selecting "chroma" as an example of setting items of the image-capturing conditions. Other operation icons for selecting setting items of the image-capturing conditions may be added to those illustrated in FIG. 7, as appropriate. Furthermore, the setting items of the image-capturing conditions may be selected and determined by a photographer. Alternatively, they may be judged and determined by the control unit 35 of the camera 1 on the basis of a detected subject image.

In FIG. 7, a region having a highlighted (thick, bright, differently colored, dashed-lined, blinking, etc.) contour among the first to sixth regions indicates a region targeted for setting (changing) image-capturing conditions. In the example in FIG. 7, the live view image 60a including the first region 61 having a highlighted contour is displayed. This means that the first region 61 is a target region for setting (changing) image-capturing conditions. The highlight of the contour of the first region 61 clearly shows the user the target region for setting (changing) image-capturing conditions. In the setting screen in FIG. 7, the first region targeted for setting (changing) image-capturing conditions is a region having the first rank assigned by the setting unit 35c.

For example, when a user taps the icon 71 in a touch-operated camera 1, the control unit 35 selects luminance as a setting item of the image-capturing conditions to be set (changed) for the highlighted region (the first region 61). It is assumed that the camera 1 is touch-operated in the following description; however, setting items of the image-capturing conditions may be selected by operation on buttons constituting the operation member 37 or the like.

<Changing in Luminance>

In the setting screen illustrated in FIG. 7, the control unit 35 which has selected luminance as the setting item of the image-capturing conditions determines image-capturing conditions corresponding to the first region 61 targeted for setting (changing) image-capturing conditions in the live view image so that the luminance of the first region 61 becomes higher (or lower) than the luminance of the reference image. For regions that are not targeted for setting (changing) image-capturing conditions (regions other than the first region 61), the control unit 35 maintains the preset image-capturing conditions to keep the luminance of the reference image.

It should be noted that in a region that is not targeted for setting (changing) image-capturing conditions, image-capturing conditions may be changed near a boundary between the region and the first region 61 so that the discontinuity of the image-capturing conditions near the boundary is blurred, in consideration of balance of the entire image.

In increasing the luminance of the first region 61, the image-capturing condition setting unit 35d determines image-capturing conditions under which the luminance is increased, by making the charge storage time longer than the charge storage time of the above-described reference conditions or making the gain higher than the gain of the above-described reference conditions, among the image-capturing conditions of the first region 61, for example.

In reducing the luminance of the first region 61, the image-capturing condition setting unit 35d determines image-capturing conditions under which the luminance is reduced, by making the charge storage time shorter than the charge storage time of the above-described reference conditions or making the gain lower than the gain of the above-described reference conditions, among the image-capturing conditions of the first region 61, for example.

In determining image-capturing conditions under which the luminance is increased or reduced, the image-capturing condition setting unit 35d determines image-capturing conditions in multiple stages (for example, in eight stages) in which the luminance gradually varies from the luminance obtained under the reference conditions. However, the upper limit of the luminance which is increased is set to a value at which a high luminance region in the first region 61 of the live view image is not saturated (not blown out in white (no clipped whites)). The lower limit of the luminance which is reduced is set to a value at which a low luminance region in the first region 61 of the live view image is not excessively dark (not shadowed in black (no clipped blacks)).

The image-capturing condition setting unit 35d determines image-capturing conditions in multiple stages to increase and reduce the luminance of the first region 61 as described above and sets image-capturing conditions in multiple stages determined in terms of luminance in the image processing unit 33. The setting in the image processing unit 33 is intended to obtain candidate images in multiple stages as described later, by image processing on the live view image.

<Change in Chroma>

In the setting screen illustrated in FIG. 7, the control unit 35 which has selected chroma as the setting item of the image-capturing conditions determines image-capturing conditions corresponding to the first region 61 targeted for setting (changing) image-capturing conditions in the live view image so that the chroma of the first region 61 becomes higher (or lower) than the chroma of the reference image. For regions that are not targeted for setting (changing) image-capturing conditions (regions other than the first region 61), the control unit 35 maintains the preset image-capturing conditions to keep the chroma of the reference image.

It should be noted that in a region that is not targeted for setting (changing) image-capturing conditions, image-capturing conditions may be changed near a boundary between the region and the first region 61 so that the discontinuity of the image-capturing conditions near the boundary is blurred, in consideration of balance of the entire image.

In increasing the chroma of the first region 61, the image-capturing condition setting unit 35d determines image-capturing conditions under which vividness of a specific color is enhanced, for example, by increasing a value of a signal read out from the green pixel Gb or Gr, the blue pixel B, or the red pixel R relative to values of signals of other color components, with respect to the image-capturing conditions of the first region 61.

In reducing the chroma of the first region 61, the image-capturing condition setting unit 35d determines image-capturing conditions under which vividness of a specific color is restricted, for example, by relatively reducing a value of a signal of a color component that is more prominent than other components, among signals read from the green pixels Gb, Gr, the blue pixel B, and the red pixel R, with respect to the image-capturing conditions of the first region 61.

In determining image-capturing conditions under which the chroma is increased or reduced, the image-capturing condition setting unit 35d determines image-capturing conditions in multiple stages (for example, in eight stages) in which the chroma gradually varies from the chroma obtained under the reference conditions. However, the upper limit of the chroma which is increased is set to a value at which a signal having a high chroma (a prominent color component) in the first region 61 of the live view image is not saturated. Additionally, the lower limit of the chroma which is reduced is set to a value at which the first region 61 of the live view image still has a certain degree of vividness of color, not an achromatic color.

The image-capturing condition setting unit 35d determines image-capturing conditions in multiple stages to increase and reduce the chroma of the first region 61 as described above and sets image-capturing conditions in multiple stages determined for the chroma in the image processing unit 33. The setting in the image processing unit 33 is intended to obtain candidate images in multiple stages as described later, by image processing on the live view image.

For example, if the preset scene capture mode of the camera 1 is a portrait mode, the image-capturing condition setting unit 35*d* determines image-capturing conditions corresponding to the first region 61 including the person 61*a* so as to reduce the chroma of the person. Additionally, the image-capturing condition setting unit 35*d* determines image-capturing conditions corresponding to the fourth region 64 including the mountain 64*a* in the background so as to increase the chroma of the mountain (make values of signals read out from the green pixels Gr and Gb higher than values of signals of other color components, for example). This is based on the idea that vividness of the background is likely to be enhanced to highlight the person 61*a* in the portrait mode.

For example, if the preset scene capture mode of the camera 1 is a cuisine mode and food served on a dish has been detected by the object detection unit 35*a* as a subject element, the image-capturing condition setting unit 35*d* determines the image-capturing conditions so as to increase the chroma for a region including the dish and the food.

For example, if the preset scene capture mode of the camera 1 is an autumn leaves mode and red autumn leaves have been detected by the object detection unit 35*a* as a subject element, the image-capturing condition setting unit 35*d* determines the image-capturing conditions so as to increase the chroma (for example, increase a value of a signal read out from the red pixel R relative to values of signals of other color components) for a region including the red autumn leaves. The same also applies to the case where the preset image-capturing scene mode of the camera 1 is the sunset mode.

For example, if the preset scene capture mode of the camera 1 is a beach mode and the ocean has been detected by the object detection unit 35*a* as a subject element, the image-capturing condition setting unit 35*d* determines the image-capturing conditions so as to increase the chroma (for example, increase a value of a signal read out from the blue pixel B relative to values of signals of other color components) for a region including the ocean or sky.

<Other Live View Images>

Figure 8:
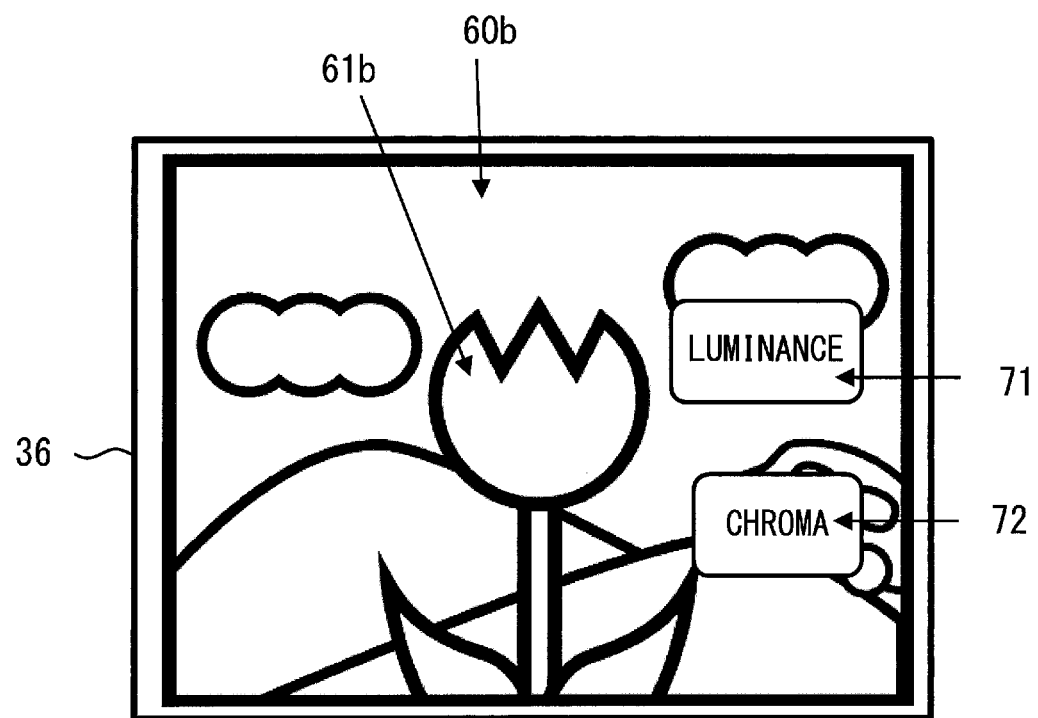
FIG. 8 is a view illustrating a setting screen for image-capturing conditions.

FIG. 8 is a view illustrating a setting screen of the liquid crystal monitor 36 that displays a live view image 60*b* different from the live view image 60*a*. For example, if the preset scene capture mode of the camera 1 is a close-up mode and a red flower has been detected by the object detection unit 35*a* as a subject element, the setting unit 35*c* assigns a first rank to a region including the red flower. This results in the first region 61*b* having a highlighted contour as the target region for setting (changing) image-capturing conditions. As described above, this is based on the idea that image-capturing conditions for the region including the flower is more likely to be set (changed) than those of other regions in the close-up mode. The icons 71 and 72 in FIG. 8 are the same as those in the setting screen illustrated in FIG. 7; thus, the description thereof will be omitted.

In the setting screen illustrated in FIG. 8, the control unit 35 which has selected chroma as the setting item of the image-capturing conditions determines image-capturing conditions for the first region 61*b* targeted for setting (changing) image-capturing conditions in the live view image so as to increase the chroma (for example, increase a value of a signal read out from the red pixel R relative to values of signals of other color components). The image-capturing condition setting unit 35*d* determines image-capturing conditions under which vividness of the color of the red flower is enhanced, by increasing a value of a signal read out from the red pixel R relative to values of signals of other color components.

As illustrated above, the image-capturing condition setting unit 35*d* determines the image-capturing conditions under which the chroma is changed, by changing a value of a signal of a color component that is more prominent than other components, among signals read from the green pixels Gb, Gr, the blue pixel B, and the red pixel R, for a color of a subject element in each of the regions partitioned by the region partitioning unit 35*b*.

<Display of Candidate Images>

If the image-capturing control unit 35*e* sets the image-capturing conditions in multiple stages in terms of luminance as described above, the image processing unit 33 creates a plurality of images (eight images in the case of the eight stages described above) having varying stages of image luminance in the first region 61 of the reference image obtained with the use of the above-described reference conditions. In this embodiment, a plurality of images created in this way are referred to as candidate images. The plurality of candidate images created by the image processing unit 33 are temporarily recorded in the working memory 34.

If the image-capturing control unit 35*e* sets the image-capturing conditions in multiple stages in terms of chroma as described above, the image processing unit 33 creates a plurality of images (eight images in the case of the eight stages described above) having varying stages of image chroma in the first region 61*b* of the above-described reference image. The plurality of images are also referred to as candidate images. The plurality of candidate images created by the image processing unit 33 are temporarily recorded in the working memory 34.

Figure 9:
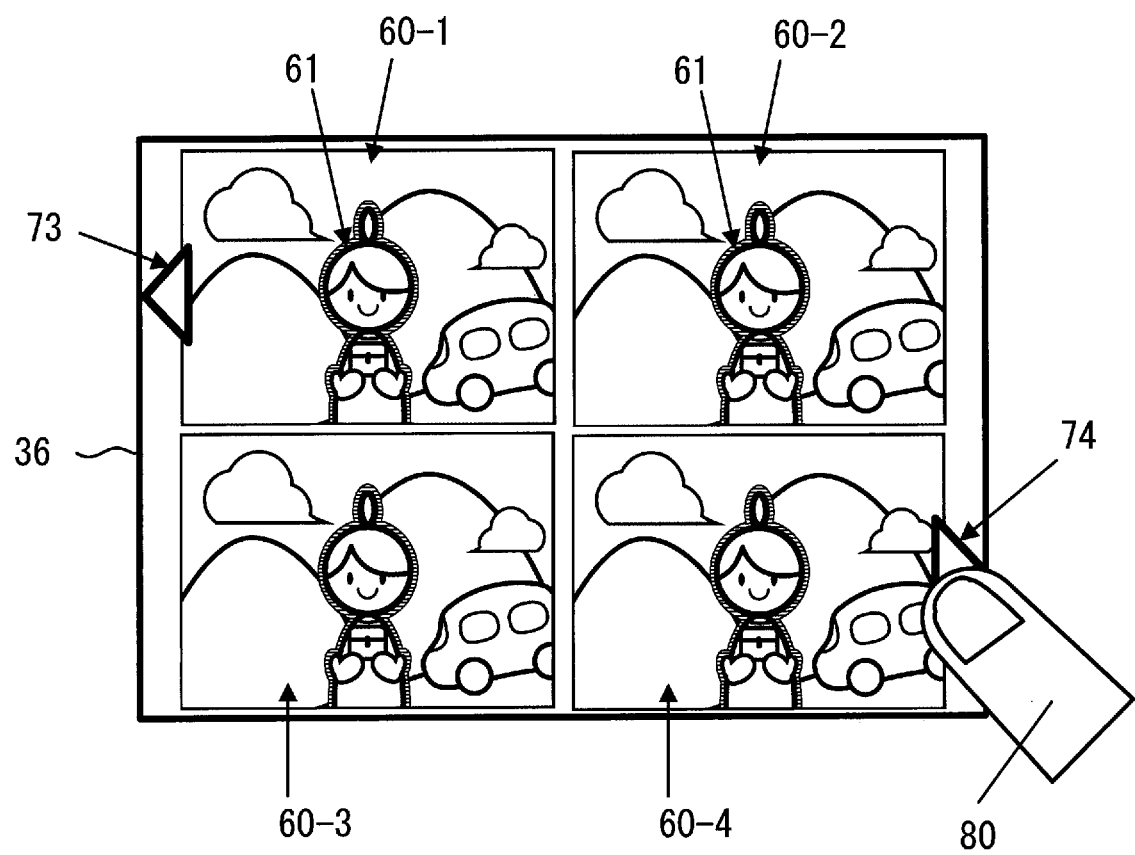
FIG. 9 is a view illustrating a display screen that displays candidate images arranged vertically and horizontally.

If the above-described plurality of candidate images are recorded in the working memory 34, the display control unit 35*g* displays the candidate images arranged vertically and horizontally on the display surface of the liquid crystal monitor 36 as illustrated in FIG. 9. FIGS. 9 to 12 are views each illustrating a screen of the liquid crystal monitor 36 that displays candidate images arranged vertically and horizontally.

If the candidate images having varying luminance in multiple stages as described above are recorded in the working memory 34, the display control unit 35*g* displays these candidate images for luminance arranged vertically and horizontally on the display surface of the liquid crystal monitor 36. Furthermore, if the candidate images having varying chroma in multiple stages as described above are recorded in the working memory 34, the display control unit 35*g* displays these candidate images for chroma arranged vertically and horizontally on the display surface of the liquid crystal monitor 36.

In FIG. 9, four candidate images (candidate images 60-1 to 60-4) of the eight candidate images are displayed. The candidate image 60-2 has a luminance (or a chroma) that is one stage higher than that of the candidate image 60-1. The candidate image 60-3 has a luminance (or a chroma) that is one stage higher than that of the candidate image 60-2. The candidate image 60-4 has a luminance (or a chroma) that is one stage higher than that of the candidate image 60-3.

Figure 10:
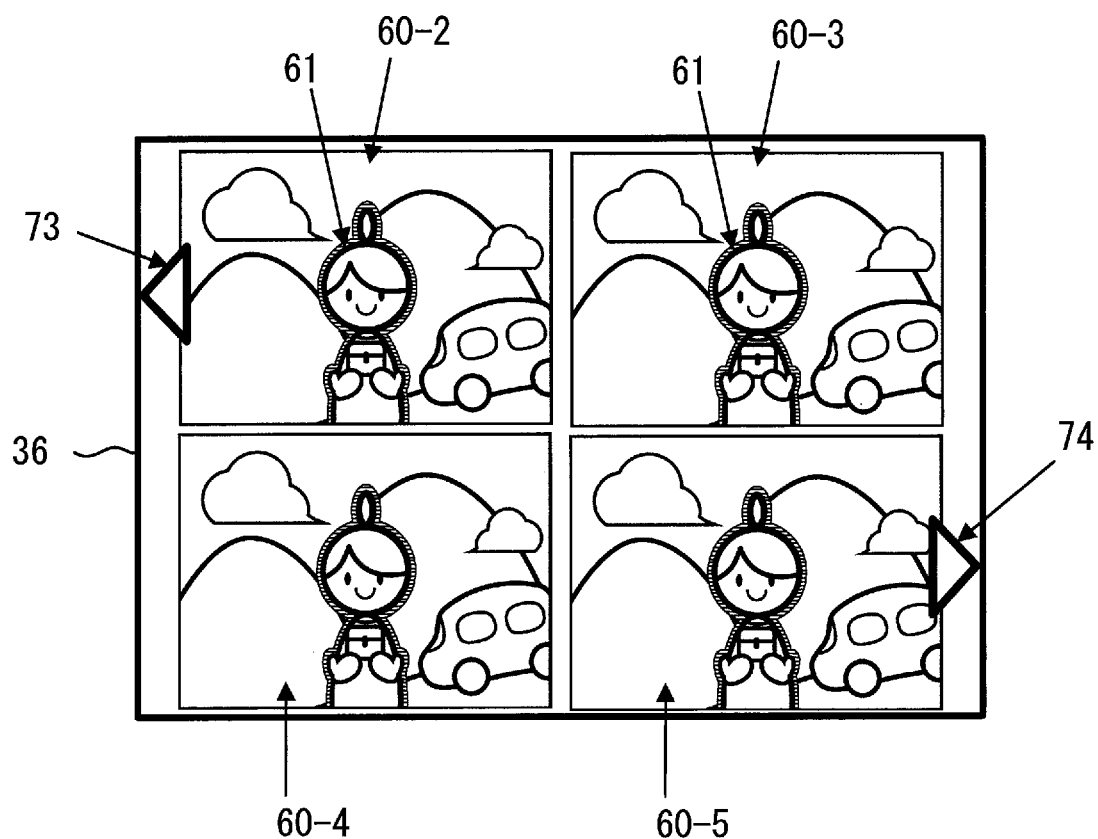
FIG. 10 is a view illustrating a display screen that displays candidate images arranged vertically and horizontally.

A left icon 73 is displayed on the left side of the candidate image 60-1 and a right icon 74 is displayed on the right side of the candidate image 60-4. For example, when a user taps the right icon 74 with a finger 80 on the display screen in FIG. 9, the display control unit 35*g* displays four candidate images (candidate images 60-2 to 60-5) of the eight candidate images, as illustrated in FIG. 10. In FIG. 10, the candidate image 60-1 is no longer displayed, which has been displayed in FIG. 9, and the candidate image 60-5 is newly displayed, which has not been displayed in FIG. 9. The candidate image 60-5 has a luminance (or a chroma) that is one stage higher than that of the candidate image 60-4.

Although not illustrated, when the user taps the left icon 73 with the finger 80 on the display screen in FIG. 10, for example, the display control unit 35g displays four of the eight candidate images (candidate images 60-1 to 60-4) as illustrated in FIG. 9. In other words, the candidate image 60-5 is no longer displayed, which has been displayed in FIG. 10, and the candidate image 60-1 is newly displayed, which has not been displayed in FIG. 10.

Figure 11:
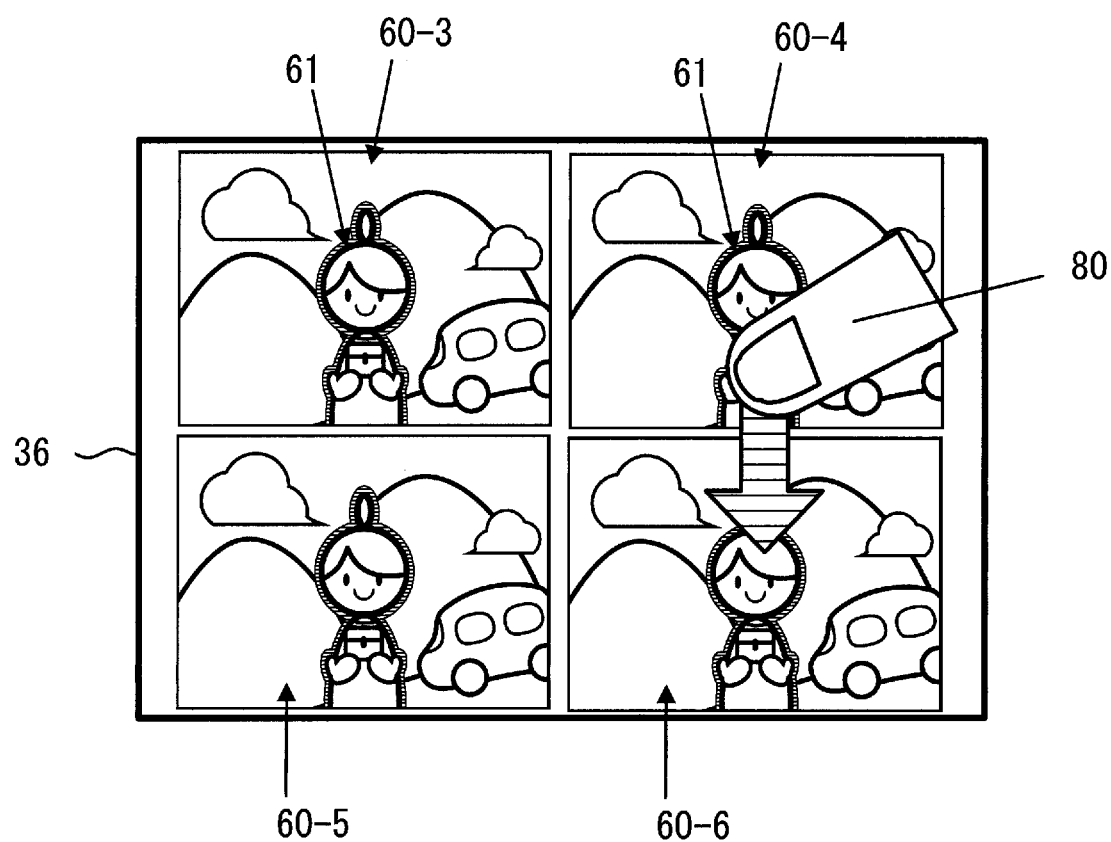
FIG. 11 is a view illustrating a display screen that displays candidate images arranged vertically and horizontally.

FIG. 11 is a view illustrating a screen of the liquid crystal monitor 36 that displays four candidate images (candidate images 60-3 to 60-6) of the eight candidate images. The candidate image 60-6 has a luminance that is one stage higher than that of the candidate image 60-5.

Figure 12:
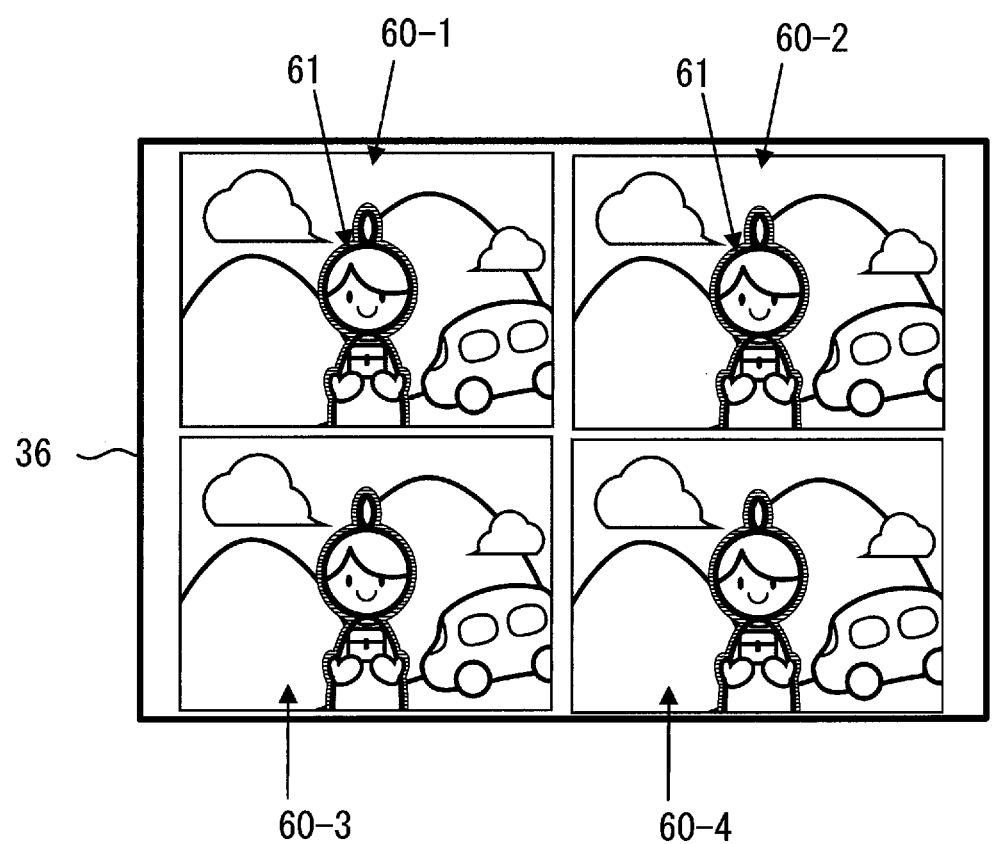
FIG. 12 is a view illustrating a display screen that displays candidate images arranged vertically and horizontally.

For example, when the user performs a vertical slide operation in the direction of the arrow in the display screen with the finger 80 on the display screen in FIG. 11, the display control unit 35g displays four candidate images (candidate images 60-1 to 60-4) of the eight candidate images. In FIG. 12, the candidate images 60-4 and 60-5 are no longer displayed, which have been displayed in FIG. 11, and the candidate images 60-1 and 60-2 are newly displayed, which have not been displayed in FIG. 11.

In this way, the user can view the plurality of candidate images. Furthermore, by the tap operation on the left icon 73 or the right icon 74 or the slide operation with the finger 80, the user can display and view candidate images that have not been displayed on the liquid crystal monitor 36.

Figure 13:
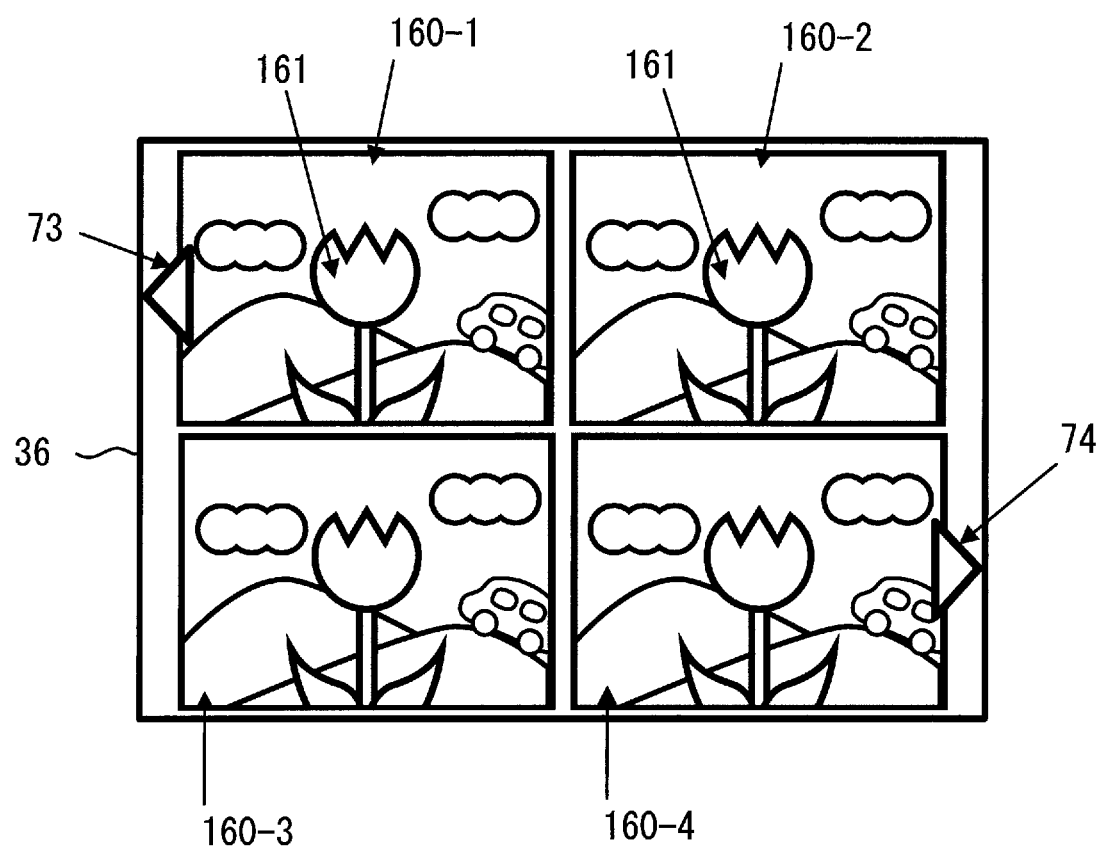
FIG. 13 is a view illustrating a display screen that displays candidate images arranged vertically and horizontally.

FIG. 13 is a view illustrating a screen of the liquid crystal monitor 36 that displays candidate images, which have varying chromas in multiple stages, arranged vertically and horizontally. In FIG. 13, four candidate images (candidate images 160-1 to 160-4) of the eight candidate images are displayed. The candidate image 160-2 has a chroma that is one stage higher than that of the candidate image 160-1. The candidate image 160-3 has a chroma that is one stage higher than that of the candidate image 60-2. The candidate image 160-4 has a chroma that is one stage higher than that of the candidate image 160-3. A left icon 73 and a right icon 74 are the same as those illustrated in FIG. 9 or FIG. 10; thus, the description thereof will be omitted.

<Selecting Operation>

The user selects one of a plurality of candidate images. For example, when the user double-taps a position at which one of a plurality of candidate images is displayed on the screen illustrated in FIGS. 9 to 12 with the finger 80, the control unit 35 determines image-capturing conditions to be applied to the first region 61 in response to the next image-capturing instruction in the following way and again displays the setting screen as illustrated in FIG. 7 on the liquid crystal monitor 36.

In other words, the control unit 35 (the image-capturing control unit 35e) sets the image-capturing conditions applied to the first area 61 of the double-tapped candidate image in the image-capturing unit 32 or the image processing unit 33. The setting in the image-capturing unit 32 is intended to achieve the change in the luminance by changing the exposure conditions of the image sensor 100 in the next image-capturing event. The setting in the image processing unit 33 is intended to achieve the change in the chroma by changing the image-capturing conditions of the image processing unit 33 in the next image-capturing event.

Specifically, when one of the plurality of candidate images for luminance is double-tapped, the image-capturing condition setting unit 35d determines exposure conditions that achieve the luminance corresponding to the double-tapped candidate image as image-capturing conditions (exposure conditions) applied for the region 61. The image-capturing control unit 35e then sets the conditions in the image-capturing unit 32.

When one of the plurality of candidate images for chroma is double-tapped on the screen illustrated in FIG. 13, the image-capturing condition setting unit 35d determines image processing conditions that achieve the chroma corresponding to the double-tapped candidate image as image-capturing conditions (image processing conditions) applied for the region 161. The image-capturing control unit 35e then sets the conditions in the image processing unit 33.

The user may perform an operation of selecting one of the plurality of candidate images in terms of luminance and then selecting one of the plurality of candidate images in terms of chroma. Furthermore, the user may perform an operation of selecting one of the plurality of candidate images in terms of chroma and then selecting one of the plurality of candidate images in terms of luminance.

Furthermore, the user may perform an operation of selecting one of the plurality of candidate images in terms of luminance or chroma, also for regions other than the first region 61, i.e., regions having second and subsequent ranks assigned by the setting unit 35c. When the setting screen as illustrated in FIG. 7 is displayed on the liquid crystal monitor 36 and the user taps a region other than the first region 61 with a finger, for example, the control unit 35 highlights the tapped region, instead of the first region 61. The image-capturing condition setting unit 35d sets the highlighted region as a target region for setting (changing) image-capturing conditions. Subsequent setting operations are the same as those in the case of the first area 61 described above.

Without the user tapping a region other than the first area 61, the control unit 35 may sequentially set regions having second and subsequent ranks assigned by the setting unit 35c as regions targeted for setting (changing) image-capturing conditions.

Although this embodiment describes an example of highlighting the contour of the region targeted for setting (changing) image-capturing conditions (the first region 61 in the above example), it may be possible to display the entire target region with a higher contrast or to blink the entire target region, instead of highlighting its contour. The target region may also be surrounded by a frame. The frame surrounding the target region may be displayed as a double frame or a single frame, and the display style of the surrounding frame such as line type may be changed as appropriate. The control unit 35 may also display an indicator for indicating a region targeted for setting image-capturing conditions, such as an arrow, in the vicinity of the target region. The control unit 35 may also display regions other than the target region for setting (changing) image-capturing conditions with a lower brightness or with a lower contrast.

When a shutter release button (not shown) constituting the operation member 37 or a display icon for instructing the start of image-capturing is activated after the image-capturing conditions for the region have been set as described above, the control unit 35 captures an image under the image-capturing conditions set for each of the partitioned regions, generates processed image data, and records the image data in a recording medium composed of a memory card (not shown) or the like.

<Description of Flowchart>

Figure 14:
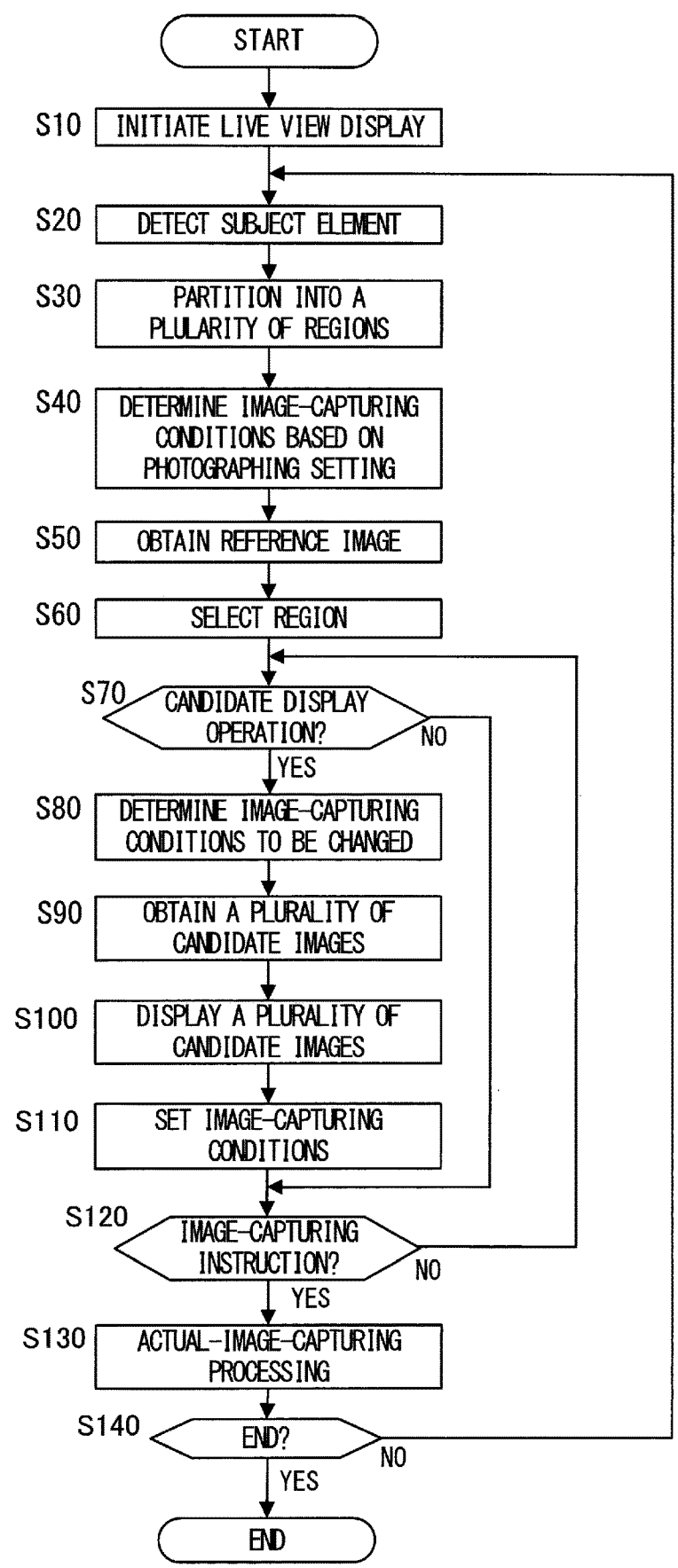
FIG. 14 is a flowchart for explaining a flow of a process of setting image-capturing conditions for each region and capturing an image.

FIG. 14 is a flowchart for explaining a flow of a process of setting image-capturing conditions for each region and capturing an image. When a main switch of the camera 1 is turned on, the control unit 35 activates a program of executing the process illustrated in FIG. 14. In step S10, the control unit 35 starts live view display on the liquid crystal monitor 36 and proceeds to step S20.

Specifically, the control unit 35 instructs the image-capturing unit 32 to start to acquire live view images and sequentially display the acquired live view images on the liquid crystal monitor 36. As described above, at that point in time, the same image-capturing conditions are set for all regions of the image-capturing chip 113, i.e., the entire screen. If the setting causes an AF operation to be performed during the live view display, the control unit 35 (the AF calculation unit 35f) controls the AF operation of focusing on a subject element corresponding to a predetermined focus point. If the setting does not allow an AF operation to be performed during the live view display, the control unit 35 (the AF calculation unit 35f) performs the AF operation later at a point in time when the AF operation is instructed.

In step S20, the control unit 35 (the object detection unit 35a) detects subject elements from the live view image and proceeds to step S30. In step S30, the control unit 35 (the region partitioning unit 35b) partitions the screen of the live view image into regions including the subject elements, and proceeds to step S40.

In step S40, the control unit 35 determines the above-described reference conditions on the basis of the setting state of the camera 1 or the state of the subject. In other words, the control unit 35 sets the same image-capturing conditions for all regions of the screen and proceeds to step S50.

In step S50, the control unit 35 uses the reference conditions to acquire a live view image (a reference image) and proceeds to step S60. In step S60, the control unit 35 selects a region targeted for setting (changing) image-capturing conditions among the regions partitioned by the region partitioning unit 35b. For example, the control unit 35 selects regions in order of ranks assigned by the setting unit 35c, beginning with the first-ranked region.

In step S70, the control unit 35 determines whether an operation for displaying the candidate image has been performed. If the user taps the icon 71 or 72 in FIG. 7 (or FIG. 8) as described above, the control unit 35 makes a positive determination in step S70 and proceeds to step S80. If the user taps neither the icon 71 nor the icon 72, the control unit 35 makes a negative determination in step S70 and proceeds to step S120.

In step S80, the control unit 35 determines image-capturing conditions to be set (changed). In other words, the control unit 35 determines a setting item corresponding to the icon 71 or 72 tapped by the user and proceeds to step S90.

In step S90, the control unit 35 (the image-capturing condition setting unit 35d) acquires a plurality of candidate images for the setting item determined in step S80 and proceeds to step S100. In step S100, the control unit 35 displays the plurality of candidate images on the display surface of the liquid crystal monitor 36 and proceeds to step S110.

In step S110, when the user performs the above-described selecting operation (for example, the double tap operation), the control unit 35 determines image-capturing conditions corresponding to the double-tapped candidate image, for the region targeted for setting (changing) image-capturing conditions. The control unit 35 then sets the conditions in image-capturing unit 32 or the image processing unit 33 and proceeds to step S120.

It should be noted that the display change of the liquid crystal monitor 36 and the setting of the image-capturing conditions in response to the user operation in step S110 have been described above.

In step S120, the control unit 35 determines a presence or absence of an image-capturing instruction. If a shutter release button (not shown) constituting the operation member 37 or a display icon for instructing image-capturing is operated, the control unit 35 makes a positive determination in step S120 and proceeds to step S130. In the case of the absence of the image-capturing instruction, the control unit 35 makes a negative determination in step S120 and returns to step S70.

In step S130, the control unit 35 performs predetermined actual-image-capturing processing. In other words, the image-capturing control unit 35e controls the image-capturing unit 32 to capture an image under the image-capturing conditions set for each of the regions, and the image processing unit 33 performs predetermined image processing on the captured and acquired image data. Then, the recording unit 39 records the image data in a recording medium (not shown).

In step S140, the control unit 35 determines whether an end operation has been performed. If the end operation has been performed, the control unit 35 makes a positive determination in step S140 and ends the process in FIG. 14. If the end operation has not been performed, the control unit 35 makes a negative determination in step S140 and returns to step S20. Returning to step S20, the control unit 35 repeats the above-described process steps.

According to the above-described embodiment, the following operations advantages can be obtained.

(1) The camera 1 includes the image-capturing unit 32 that captures an image of a subject with the image sensor 100 configured to be able to set image-capturing conditions for the plurality of regions on the image-capturing surface; and the control unit 35 that determines parameters in changing image-capturing conditions for each region, based on the subject element detected from the captured live view image. Since the camera 1 automatically determines the parameters for changing image-capturing conditions for each region, the user can easily set image-capturing conditions for each region.

(2) The control unit 35 determines the parameters on the basis of the subject element and the preset image-capturing mode. This allows suitable parameters to be automatically determined depending on the types of the subject elements (e.g., person, mountain, flower, and so on) and the image-capturing modes (e.g., portrait mode, landscape mode, and so on). The user can thus easily set image-capturing conditions for each region.

(3) The camera 1 includes the image processing unit 33 that generates candidate images under image-capturing conditions varied with parameters determined by the control unit 35, in at least one of a plurality of regions in the captured live view image. This allows the user to observe the effects due to the changes in the image-capturing conditions for the region while viewing candidate images which are the processed live view images, before actual image-capturing.

(4) The control unit 35 determines a plurality of parameters, and the image processing unit 33 uses the plurality of parameters determined by the control unit 35, which are different from one another, to generate a plurality of candidate images having varying stages of image-capturing conditions. This allows the user to compare the effects due to the changes in the image-capturing conditions, while viewing the plurality of candidate images having varying stages of image-capturing conditions.

(5) The image-capturing condition may be luminance or chroma, and the image processing unit 33 generates a plurality of candidate images having varying stages of luminance or chroma. This allows the user to compare the effects due to the changes in the luminance (or the chroma), while viewing the plurality of candidate images having varying stages of luminance (or chroma).

(6) The image processing unit 33 generates the captured live view image as the reference image before the change in the image-capturing conditions, and also generates candidate images after the change in the image-capturing conditions. This allows the user to observe the effects due to the changes in the image-capturing conditions for the region, comparing with images before and after the changes in the image-capturing conditions.

(7) The image processing unit 33 generates the reference image, an image having a higher luminance than that of the reference image, and/or an image having a lower luminance than that of the reference image. This allows the user to observe the effects due to the changes in the luminance for the region, comparing with images before and after the changes in the luminance.

(8) The image processing unit 33 generates the reference image, an image having a higher chroma than that of the reference image, and/or an image having a lower chroma than that of the reference image. This allows the user to observe the effects due to the changes in the chroma for the region, comparing with images before and after the changes in the chroma.

(9) Since the camera 1 includes the liquid crystal monitor 36 that displays the image generated by the image processing unit 33, the user can visually compare the effects due to the change in the image-capturing conditions for the region.

(10) The camera 1 includes the control unit 35. If an operation of selecting the candidate image displayed on the liquid crystal monitor 36 is performed, the control unit 35 sets image-capturing conditions corresponding to parameters used for the generation of the candidate image, for a region of the image-capturing surface of the image-capturing unit 32 corresponding to the region for which the candidate image are generated. The user can thus easily set image-capturing conditions for each region.

(11) The camera 1 includes the display control unit 35g that displays a region representing an image created under image-capturing conditions varied by the image processing unit 33, among the plurality of regions, in a manner different from other regions on the liquid crystal monitor 36. This can clearly show the user the region targeted for setting (changing).

The following variations also fall within the scope of the present invention, and one or more of the variations may be combined with the above-described embodiment.

(First Variation)

The above description illustrates the example in which the display control unit 35g displays the plurality of candidate images arranged vertically and horizontally on the display surface of the liquid crystal monitor 36, as illustrated in FIGS. 9 and 13. Alternatively, the reference image may be displayed on the display surface of the liquid crystal monitor 36. In this case, only an image of a region targeted for setting (changing) image-capturing conditions (the first region 61 in the above example) in the reference image may be replaced with an image of a corresponding region in a certain candidate image.

Figure 15:
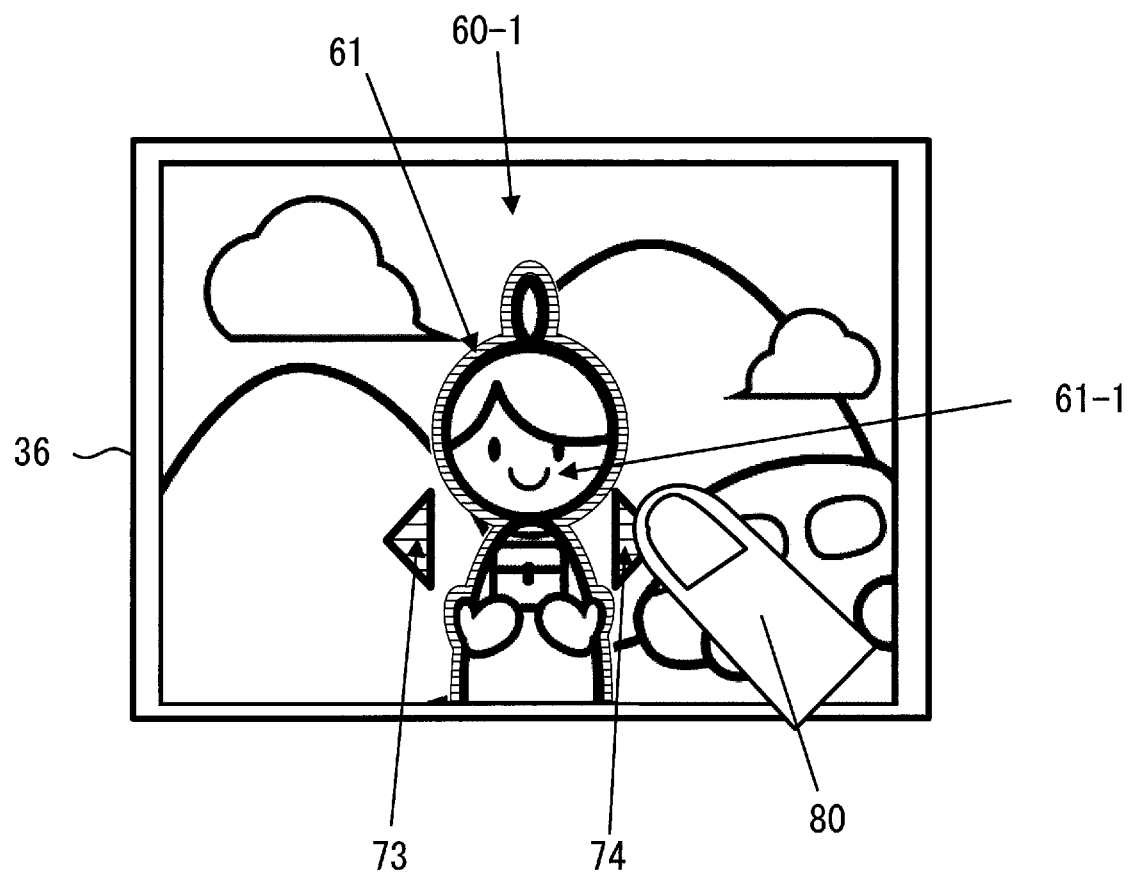
FIG. 15 is a view illustrating a display screen according to a first variation.
Figure 16:
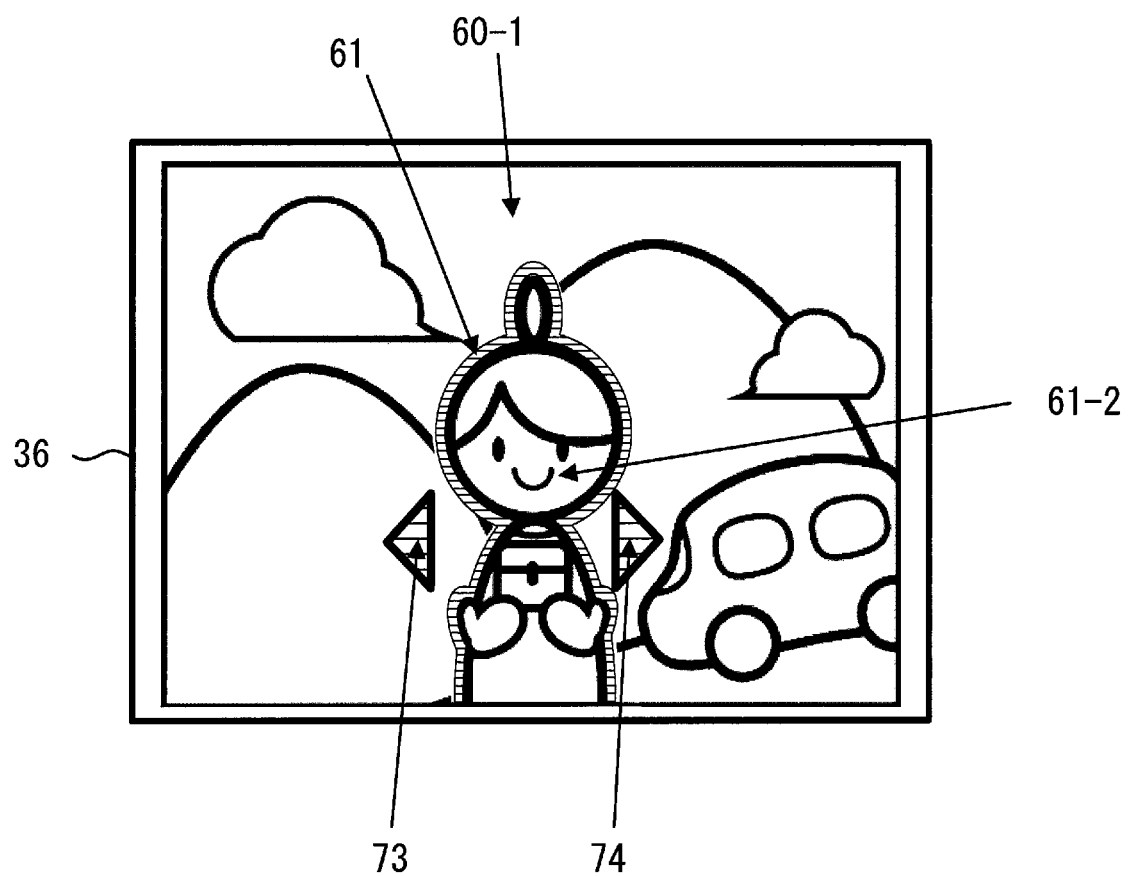
FIG. 16 is a view illustrating a display screen according to a first variation.

FIGS. 15 and 16 are views illustrating display screens according to a first variation. In the first variation, if the plurality of candidate images described above are stored in the working memory 34, the display control unit 35g displays the reference image (the reference image 60-1) based on the reference conditions on the display surface of the liquid crystal monitor 36 as illustrated in FIG. 15. At this time, the image in the first area 61 is the reference image 61-1.

This variation is the same as the above embodiment in that the contour of the first area 61 targeted for setting (changing) image-capturing conditions is highlighted.

In FIG. 15, a left icon 73 is displayed on the left side of the first region 61 and a right icon 74 is displayed on the right side of the first region 61. For example, when the user taps the right icon 74 with the finger 80 on the display screen in FIG. 15, the display control unit 35g displays a composite image in which only the image in the first region 61 is replaced with the candidate image 61-2, as illustrated in FIG. 16. The reference image 60-1 remains to be displayed in background regions other than the first region 61.

The candidate image 61-2 has a luminance (or a chroma) that is one stage higher than that of the candidate image 61-1. In this way, the display control unit 35g reads out an necessary candidate image 60-2 among the eight candidate images temporarily stored in the working memory 34, in accordance with the tap operation on the right icon 74. The display control unit 35g then extracts only the candidate image 61-2 in the first region 61 of the read out image 60-2 and uses the image 61-2 for the composite display illustrated in FIG. 16.

Although not illustrated, when the user taps the left icon 73 with the finger 80 on the display screen in FIG. 16, for example, the display control unit 35g displays a composite image in which the image in the first region 61 is replaced with the reference image 61-1, as illustrated in FIG. 15. The reference image 60-1 remains to be displayed in background regions other than the first region 61.

According to the first variation, the user can view candidate images for the first region 61 targeted for setting (changing) image-capturing conditions. Furthermore, by the tap operation on the left icon 73 or the right icon 74, the user can display and view other candidate images in the first region 61.

In the first variation, when a candidate image is displayed and the user double-taps any position in the screen with the finger 80, the control unit 35 (the image-capturing condition setting unit 35d) determines image-capturing conditions applied for a candidate image 61-n (where n is a natural number of 1 to 8) that is displayed in the first region 61 at that point in time, as image-capturing conditions to be applied for the first region 61 in response to the next image-capturing instruction. Then, the control unit 35 again displays the setting screen as illustrated in FIG. 7 on the liquid crystal monitor 36.

This variation is the same as the above embodiment in that the user may perform an operation of selecting one of the plurality of candidate images in terms of luminance and then selecting one of the plurality of candidate images in terms of chroma and in that the user may perform an operation of selecting one of the plurality of candidate images in terms of chroma and then selecting one of the plurality of candidate images in terms of luminance.

Additionally, this variation is the same as the above embodiment in that the user may set (change) image-capturing conditions in terms of luminance or chroma, also for regions other than the first region 61, i.e., regions having second and subsequent ranks assigned by the setting unit 35c.

(Second Variation)

Figure 17:
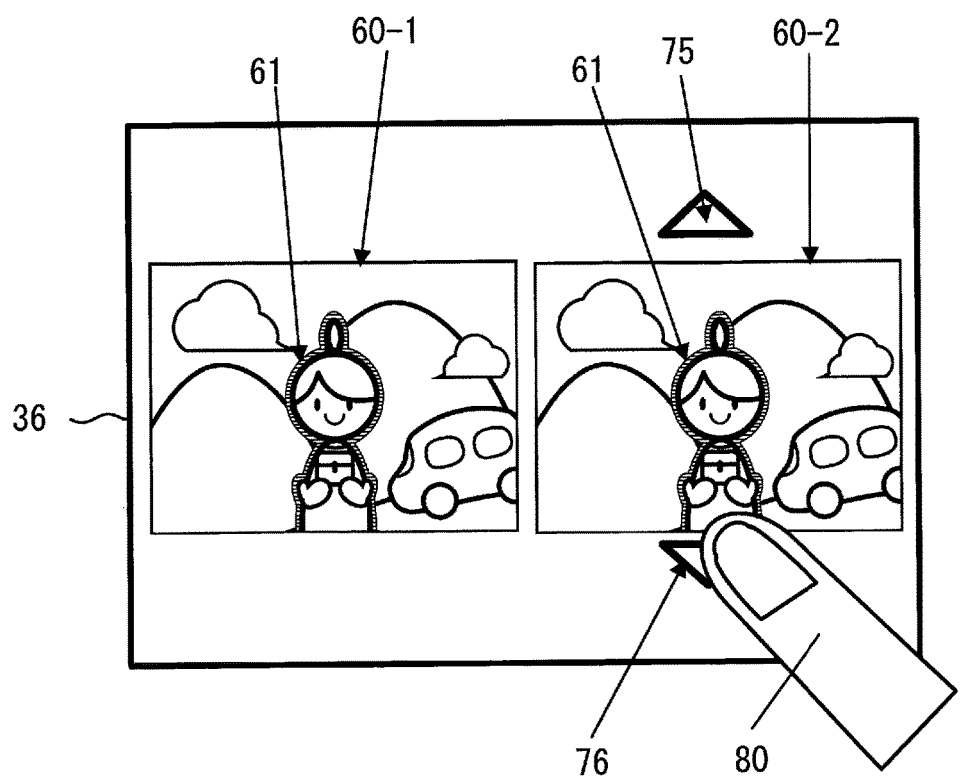
FIG. 17 is a view illustrating a display screen according to a second variation.
Figure 18:
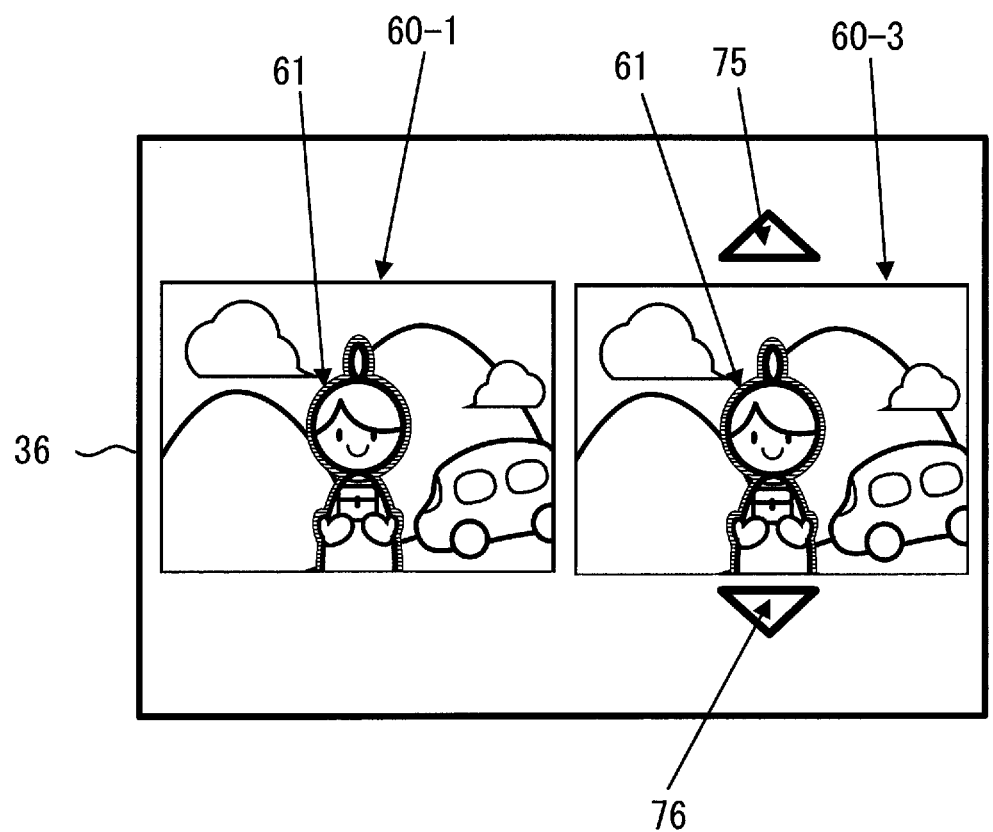
FIG. 18 is a view illustrating a display screen according to a second variation.

FIGS. 17 and 18 are views illustrating display screens according to a second variation. In the second variation, if the plurality of candidate images described above are stored in the working memory 34, the display control unit 35g displays the reference image (the reference image 60-1) based on the reference conditions on the left side of the display surface of the liquid crystal monitor 36 and also displays the candidate image 60-2 on the right side of the display surface, as illustrated in FIG. 17.

This variation is the same as the above embodiment in that the contour of the first area 61 targeted for setting (changing) the image-capturing conditions is highlighted.

In FIG. 17, an upper icon 75 is displayed above the right candidate image 60-2 and a lower icon 76 is displayed below the candidate image 60-2. For example, when the user taps the lower icon 76 with the finger 80 on the display screen in FIG. 17, the display control unit 35g displays a candidate image 60-3, in place of the right candidate image 60-2, as illustrated in FIG. 18. The left reference image 60-1 remains to be displayed.

The candidate image 60-3 has a luminance (or a chroma) that is one stage higher than that of the candidate image 60-2. In this way, the display control unit 35g reads out the necessary candidate image 60-3 among the eight candidate images temporarily stored in the working memory 34, in accordance with the tap operation on the down icon 76, and uses the candidate image 60-3 for display as illustrated in FIG. 18.

Although not illustrated, when the user taps the up icon 75 with the finger 80 on the display screen in FIG. 18, for example, the display control unit 35g displays the candidate image 60-2 in place of the candidate image 60-3 displayed on the right side of the screen, as illustrated in FIG. 17. The reference image 60-1 remains to be displayed on the left side of the screen.

According to the second variation, the user can view the candidate images in conjunction with the reference image. Furthermore, by the tap operation on the up icon 75 or the down icon 76, the user can display and view other candidate images that have not been displayed on the liquid crystal monitor 36.

In the second variation, when a candidate image is displayed and the user double-taps any position in the screen with the finger 80, the control unit 35 (the image-capturing condition setting unit 35d) determines image-capturing conditions applied for a candidate image 60-n (where n is a natural number of 1 to 8) that is displayed on the right side of the display surface at that point in time, as image-capturing conditions to be applied for the first region 61 in response to the next image-capturing instruction. Then, the control unit 35 again displays the setting screen as illustrated in FIG. 7 on the liquid crystal monitor 36.

This variation is the same as the above embodiment in that the user may perform an operation of selecting one of the plurality of candidate images in terms of luminance and then selecting one of the plurality of candidate images in terms of chroma and in that the user may perform an operation of selecting one of the plurality of candidate images in terms of chroma and then selecting one of the plurality of candidate images in terms of luminance.

Additionally, this variation is the same as the above embodiment in that the user may set (change) image-capturing conditions in terms of luminance or chroma, also for regions other than the first region 61, i.e., regions having second and subsequent ranks assigned by the setting unit 35c.

(Third Variation)

The above embodiment illustrates, as one example of the method of determining reference conditions, a method of selecting one of the "program auto" mode, the "shutter speed priority auto" mode, the "aperture priority auto" mode, and the "manual" mode is selected so that a predetermined exposure calculation is performed in accordance with the selected exposure mode to determine a correct exposure; and determining the image-capturing conditions prepared for a standard image quality, wherein the determined exposure conditions and the image processing conditions are determined as reference conditions. Alternatively, the reference conditions may be determined as follows.

<Example of Determining Reference Conditions in Terms of Luminance>

The third variation changes the way of determining a correct exposure depending on the scene capture mode setting of the camera 1 and the subject element detected by the object detection unit 35a, and sets the conditions determined here as reference conditions (exposure conditions). For example, if the preset scene capture mode of the camera 1 is a portrait mode and the object detection unit 35a has detected a person as a subject element, the control unit 35 determines exposure conditions for a region including the person so that the luminance of the person is appropriate, and sets the exposure conditions as reference conditions.

For example, if the preset scene capture mode of the camera 1 is a night view portrait mode and the object detection unit 35a has detected a person as a subject element, the control unit 35 determines exposure conditions for a region including the person so that the luminance of the person becomes higher, and further determines correct exposure conditions for the region including night view in the background in consideration of the luminance of the night view. The control unit 35 then sets the exposure conditions as reference conditions. Furthermore, when the light-emitting device 40 is caused to emit light, a correct exposure is determined to balance luminances of both the person and the background and accordingly a required light emission amount of the light-emitting device 40 is calculated.

For example, if the preset scene capture mode of the camera 1 is a landscape mode and the photographing distance is farther than a predetermined distance (approximately infinite), the control unit 35 determines exposure conditions so that a luminance of a subject element (for example, a mountain) is appropriate for a region including the mountain on the basis of a proportion of the color components (the green pixels Gb, Gr, the blue pixel B, and the red pixel R) and the luminance of the subject element. The control unit 35 then sets the exposure conditions as reference conditions.

<Example of Determining Reference Conditions in Terms of Chroma>

In the third variation, image processing conditions prepared in addition to conditions for a standard image quality are set as reference conditions (exposure conditions), depending on the scene capture mode setting of the camera 1 and the subject element detected by the object detection unit 35a.

If a region partitioned by the region partitioning unit 35b has a signal of a color component that is more prominent than other color components among the signals read from the green pixels Gb, Gr, the blue pixel B, and the red pixel R, the control unit 35 determines conditions so that a raw image without any processing (a flat image) is obtained for the region. The control unit 35 then sets the conditions determined in this way as reference conditions.

For example, if the preset scene capture mode of the camera 1 is a close-up mode and a red flower has been detected by the object detection unit 35a as a subject element, the setting unit 35c determines conditions for the region including the red flower so that the exposure is reduced to reduce saturation of the red component. The setting unit 35c then sets the conditions determined in this way as reference conditions.

(Fourth Variation)

Although the above description illustrates the camera 1 as an example, mobile devices including an advanced mobile phone 250 such as a smartphone having a camera function or a tablet terminal may be employed.

(Fifth Variation)

The above embodiment illustrates the camera 1 having the image-capturing unit 32 and the control unit 35 integrated into a single electronic device, as one example. An image-capturing system 1B may instead be configured in which the image-capturing unit 32 and the control unit 35 are separately provided and the control unit 35 controls the image-capturing unit 32 via communication means, for example. An example will be described below in which a controller 1002 including the control unit 35 controls an image-capturing apparatus 1001 including the image-capturing unit 32.

Figure 19:
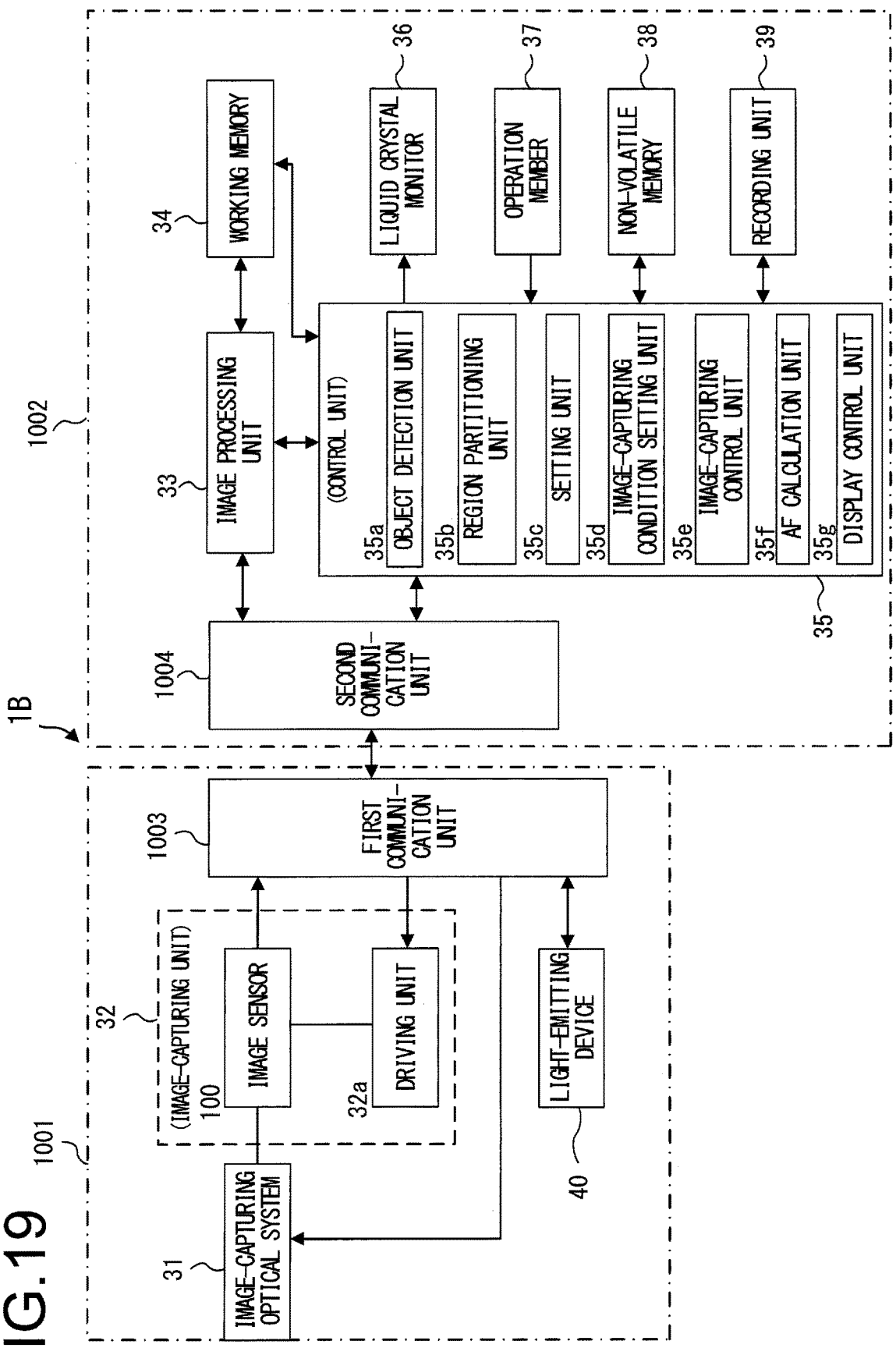
FIG. 19 is a block diagram illustrating a configuration of an image-capturing system according to a fifth variation.

FIG. 19 is a block diagram illustrating a configuration of the image-capturing system 1B according to a fifth variation. In FIG. 19, the image-capturing system 1B is composed of the image-capturing apparatus 1001 and the display device 1002. The image-capturing apparatus 1001 includes a first communication unit 1003 in addition to the image-capturing optical system 31 and the image-capturing unit 32 described in the above embodiment. The display device 1002 includes a second communication unit 1004 in addition to the image processing unit 33, the working memory 34, the control unit 35, the liquid crystal monitor 36, the operation member 37, the non-volatile memory 38, the recording unit 39, and the light-emitting device 40 as described in the above embodiment.

The first communication unit 1003 and the second communication unit 1004 can bidirectionally communicate data by well-known wireless communication technology, optical communication technology, or the like. The first communication unit 1003 and the second communication unit 1004 may also bidirectionally communicate data by wired connection between the image-capturing apparatus 1001 and the display device 1002 with a wire cable.

In the image-capturing system 1B, the control unit 35 performs data communication via the second communication unit 1004 and the first communication unit 1003 to control the image-capturing unit 32. For example, predetermined control data is transmitted and received between the image-capturing apparatus 1001 and the display device 1002, so that the display device 1002 partitions a screen into a plurality of regions, ranks the partitioned regions, sets different image-capturing conditions for different partitioned regions, reads out an image-capturing signal captured in each region, and so on, on the basis of the image as described above.

According to the fifth variation, a live view image acquired in the image-capturing apparatus 1001 and transmitted to the display device 1002 is displayed on the liquid crystal monitor 36 of the display device 1002. The user can thus remotely operate the image-capturing apparatus 1001 via the display device 1002 remote from the image-capturing apparatus 1001. The display device 1002 may include an advanced mobile phone 250 such as a smartphone. The image-capturing apparatus 1001 may include an electronic device including the above-described stacked image sensor. In the above-described example, the control unit 35 of the display device 1002 includes the object detection unit 35a, the region partitioning unit 35b, the setting unit 35c, the image-capturing condition setting unit 35d, the image-capturing control unit 35e, the AF calculation unit 35f, and the display control unit 35g. Alternatively, the image-capturing apparatus 1001 may include parts of the object detection unit 35a, the region partitioning unit 35b, the setting unit 35c, the image-capturing condition setting unit 35d, the image-capturing control unit 35e, the AF calculation unit 35f, and the display control unit 35g.

(Sixth Variation)

Figure 20:
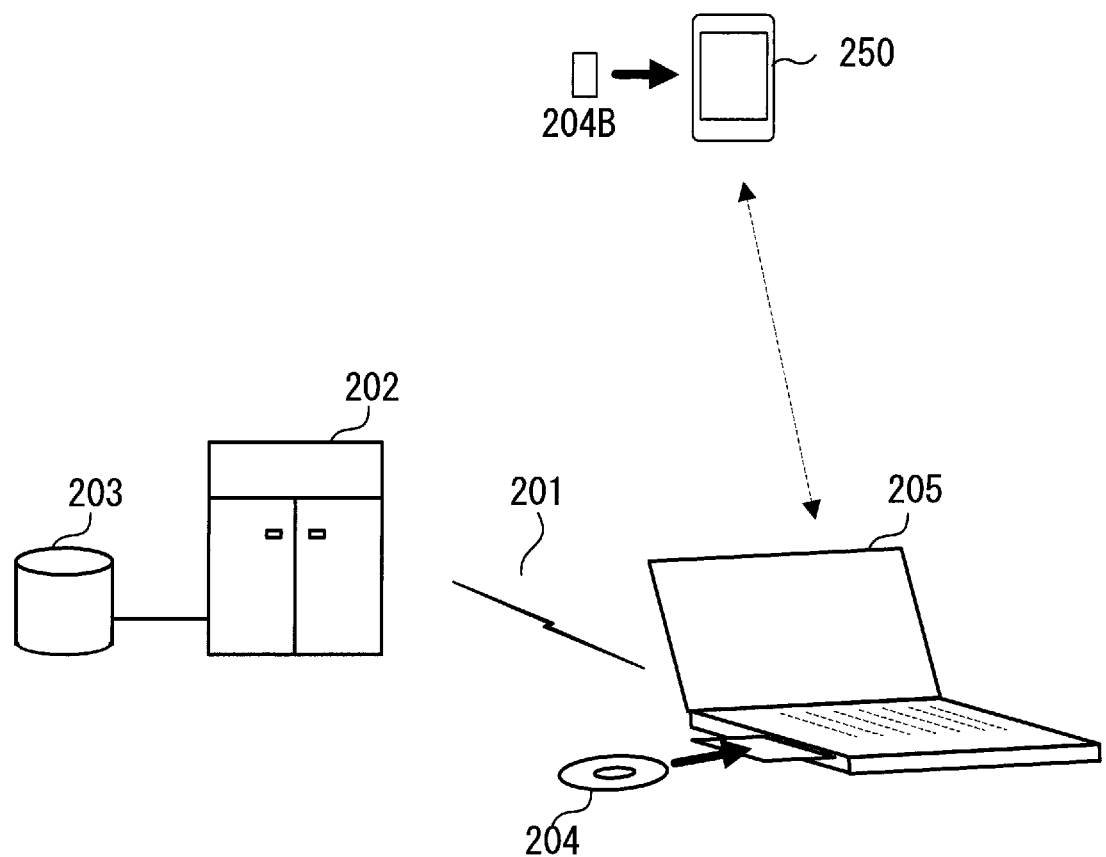
FIG. 20 is a view for explaining supply of a program to a mobile device.

As illustrated in FIG. 20, for example, programs may be supplied from a personal computer 205 storing the programs to a mobile device such as the camera 1, the advanced mobile phone 250, or a tablet terminal as described above, via infrared communication or near field communication.

The personal computer 205 may be supplied with the programs by a recording medium 204 such as a CD-ROM storing the programs, which is inserted in the personal computer 205. Alternatively, the programs may be loaded into the personal computer 205 via a communication line 201 such as a network. In the case of using the communication line 201, the programs are stored in a storage device 203 of a server 202 connected to the communication line or other storage devices.

The programs may also be directly transmitted to the mobile device via an access point (not shown) of a wireless LAN connected to the communication line 201. Alternatively, a recording medium 204B such as a memory card storing the programs may be inserted into the mobile device. Thus, the programs may be supplied in various forms of computer program products, such as products supplied via a recording medium or a communication line.

Although various embodiments and variations have been described above, the present invention is not limited to these embodiments and variations. Other aspects contemplated within the technical idea of the present invention are also encompassed within the scope of the present invention.

The disclosure of the following priority application is incorporated herein by reference:

Japanese Patent Application No. 2015-70439 (filed Mar. 30, 2015)

REFERENCE SIGNS LIST

1 . . . camera
1B . . . image-capturing system
32 . . . image-capturing unit
35 . . . control unit
35a . . . object detection unit
35b . . . region partitioning unit
35c . . . setting unit
35d . . . image-capturing condition setting unit
35e . . . image-capturing control unit
35g . . . display control unit
36 . . . liquid crystal monitor
40 . . . light-emitting device
100 . . . image sensor 1001 . . . image-capturing apparatus
1002 . . . display device

The invention claimed is:

1. An electronic device, comprising:
an image sensor that includes a plurality of image-capturing regions in which a subject is captured;
a display that displays a plurality of images of the subject captured in a first image-capturing region of the plurality of image-capturing regions; and
a processor configured to:
set first image-capturing conditions for the first image-capturing region of the image sensor based on an image selected from the plurality of images displayed on the display, the first image-capturing conditions being different from second image-capturing conditions for a second image-capturing region of the plurality of image-capturing regions of the image sensor, the second image-capturing region being arranged in a row direction side from the first image-capturing region; and
control the image sensor to capture the subject in at least the first image-capturing region and the second image-capturing region of the plurality of image-capturing regions of the image sensor, the first image-capturing region capturing the subject with the first image-capturing conditions, and the second image-capturing region capturing the subject with the second image-capturing conditions, wherein:
the image sensor includes a first control line for outputting a control signal for causing the first image-capturing region to capture the subject with the first image-capturing conditions, and a second control line for outputting a control signal for causing the second image-capturing region to capture the subject with the second image-capturing conditions, that is different from the first control line.

2. The electronic device according to claim 1, wherein the processor is configured to:
determine the first image-capturing conditions, based on the subject captured in the first image-capturing region and an image-capturing mode set in the image sensor.

3. The electronic device according to claim 2, wherein the processor is configured to:
generate a candidate image by varying at least one of image-capturing conditions for the plurality of image-capturing regions of the image sensor.

4. The electronic device according to claim 3, wherein the processor is configured to:
generate a plurality of candidate images having varying stages of the image-capturing conditions.

5. The electronic device according to claim 4, wherein:
the image-capturing conditions are at least one of luminance and chroma; and
the processor is configured to generate the plurality of candidate images having varying stages of the luminance or the chroma.

6. The electronic device according to claim 5, wherein the processor is configured to:
generate a captured image before a change in the image-capturing conditions as a reference image, and generate the plurality of candidate images after the change in the image-capturing conditions for each of the plurality of image-capturing regions of the image sensor.

7. The electronic device according to claim 6, wherein the processor is configured to:
generate the reference image and an image having a luminance different from a luminance of the reference image.

8. The electronic device according to claim 6, wherein the processor is configured to:
generate the reference image and an image having a chroma different from a chroma of the reference image.

9. The electronic device according to claim 1, wherein:
the plurality of image-capturing regions of the image sensor perform a photoelectric conversion that converts light into an electric charge.

10. The electronic device according to claim 9, further comprising:
a plurality of photoelectric conversion units that perform the photoelectric conversion are arranged along a first direction and a second direction which intersects the first direction in the plurality of image-capturing regions of the image sensor.

* * * * *